US008293847B2

(12) United States Patent  (10) Patent No.: US 8,293,847 B2
Masuko et al.  (45) Date of Patent: Oct. 23, 2012

(54) FILM-LIKE ADHESIVE, ADHESIVE SHEET, AND SEMICONDUCTOR DEVICE USING SAME

(75) Inventors: Takashi Masuko, Tsukuba (JP); Minoru Sugiura, Tsuchiura (JP); Shigeki Katogi, Chikusei (JP); Masami Yusa, Chikusei (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 545 days.

(21) Appl. No.: 12/376,347

(22) PCT Filed: Aug. 4, 2006

(86) PCT No.: PCT/JP2006/315493
§ 371 (c)(1), (2), (4) Date: Feb. 4, 2009

(87) PCT Pub. No.: WO2008/015759
PCT Pub. Date: Feb. 7, 2008

(65) Prior Publication Data
US 2010/0239858 A1   Sep. 23, 2010

(51) Int. Cl.
*C08L 75/04* (2006.01)
(52) U.S. Cl. .......... 525/428; 428/354; 525/423; 528/65; 528/310
(58) Field of Classification Search .......... 428/354; 528/65, 310, 902; 525/423, 428; 524/590
See application file for complete search history.

(56) References Cited

U.S. PATENT DOCUMENTS

| 4,734,462 A | 3/1988 | Liedloff et al. |
| 4,929,358 A * | 5/1990 | Koenitzer ..................... 210/640 |
| 5,310,850 A | 5/1994 | Chen et al. |
| 6,777,464 B1 | 8/2004 | Watanabe et al. |
| 2005/0255278 A1 | 11/2005 | Matsuura et al. |

FOREIGN PATENT DOCUMENTS

| CN | 1637034 | 7/2005 |
| CN | 1696233 | 11/2005 |
| JP | 62-227931 | 10/1987 |
| JP | 03-192178 | 8/1991 |
| JP | 04-196246 | 7/1992 |
| JP | 04-234472 | 8/1992 |
| JP | 7242820 | 9/1995 |
| JP | 07-252459 | 10/1995 |
| JP | 09-017810 | 1/1997 |
| JP | 09-194566 | 7/1997 |
| JP | 10-168204 | 6/1998 |
| JP | 10-258600 | 9/1998 |
| JP | 10-330724 | 12/1998 |
| JP | 3014578 | 12/1999 |
| JP | 2002-088325 | 3/2002 |
| JP | 2003-041210 | 2/2003 |
| JP | 2003-292575 | 10/2003 |
| JP | 2003-335943 | 11/2003 |
| JP | 2004-124015 | * 4/2004 |
| JP | 2005-220339 | 8/2005 |
| JP | 2005-220340 | 8/2005 |
| JP | 2006-225566 | 8/2006 |
| JP | 2006-225567 | 8/2006 |
| JP | 2006-241174 | 9/2006 |
| KR | 10-2005-0073528 | 7/2005 |
| TW | 288170 | 10/2007 |
| WO | WO 98/44067 | 10/1998 |

OTHER PUBLICATIONS

Derwent abstract of JP 2005-220340 (2005).*
Translation of the International Preliminary Report on Patentability dated Feb. 19, 2009, for Application No. PCT/JP2006/315493.
Korean Official Action issued on Sep. 29, for Application No. 10-2009-7002280.
Japanese Official Action issued Feb. 15, 2011, for JP Application No. 2005-043135.
Japanese Official Action issued Feb. 15, 2011, for JP Application No. 2005-043139.
Taiwanese Official Action issued on Oct. 7, 2009, for Application No. 0982063072001.
Chinese Official Action issued May 5, 2011, for CN Application No. 2006800555259.
Japanese Official Action issued Sep. 27, 2011, for JP Application No. 2008-527630.
Singapore Official Action issued Mar. 26, 2012, for SG Application No. 201104976-4.

\* cited by examiner

*Primary Examiner* — Gregory Listvoyb
(74) *Attorney, Agent, or Firm* — Antonelli, Terry, Stout & Kraus, LLP.

(57) ABSTRACT

An object of the present invention is to provide a film-like adhesive capable of achieving a superior combination of processability and reflow resistance. A film-like adhesive of the present invention is used for bonding a semiconductor element to an adherend, and includes an adhesive layer comprising at least one resin selected from the group consisting of polyurethaneimide resins, polyurethaneamideimide resins and polyurethaneimide-polyurethaneamideimide resins.

12 Claims, 4 Drawing Sheets

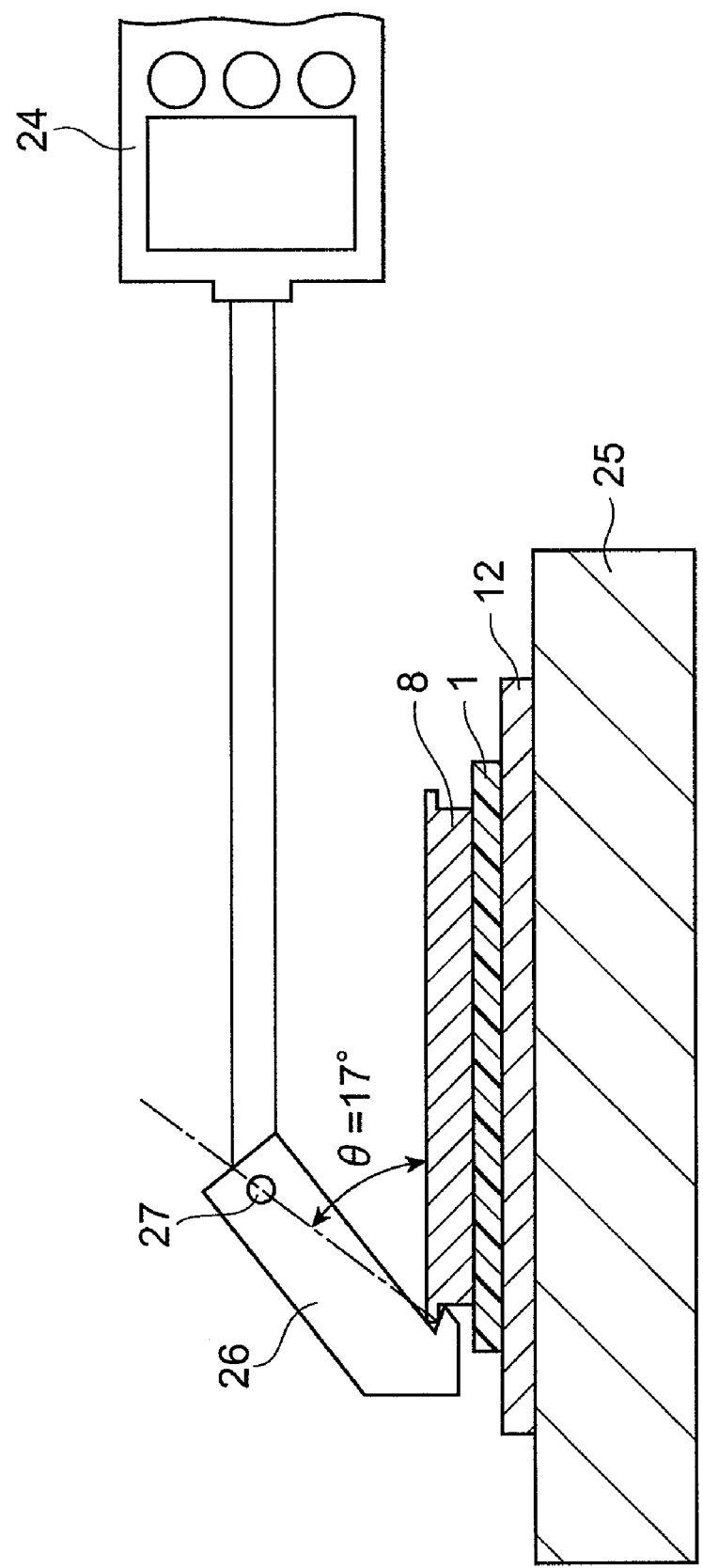

FILM-LIKE ADHESIVE, ADHESIVE SHEET, AND SEMICONDUCTOR DEVICE USING SAME

TECHNICAL FIELD

The present invention relates to a film-like adhesive that is used for mounting a semiconductor element on an adherend such as a support member for mounting a semiconductor element, and also relates to an adhesive sheet that uses such an adhesive, and a semiconductor device.

BACKGROUND ART

Conventionally, die bonding adhesives for forming a die bonding layer that is used to bond a semiconductor element to a support member for mounting the semiconductor element such as a lead frame have predominantly employed silver pastes. However, in the case of silver pastes, recent trends to larger semiconductor elements, together with reductions in the size of, and improvements in the performance of, semiconductor packages, have meant that the following problems have become more prevalent. Namely, these problems include paste protrusion following die bonding caused by the spreading properties of the paste, the occurrence of defects during wire bonding as a result of tilting of the semiconductor element, unsatisfactory precision in the thickness of the die bonding layer, and the occurrence of voids within the die bonding layer. As a result of these problems, satisfying the demands for further miniaturization and increased detail of support members in order to cope with these size reductions and performance improvements occurring within the semiconductor packages has proven difficult. Accordingly, in recent years, film-like adhesives that are advantageous for achieving further miniaturization and increased detail of support members have become widely used as die bonding adhesives (for example, see Japanese Patent Laid-Open No. H03-192178 and Japanese Patent Laid-Open No. H04-234472). These film-like adhesives are used, for example, in production methods for semiconductor packages (semiconductor devices) that employ individual bonding methods or wafer backside laminating methods.

In individual bonding methods, a film-like adhesive stored on a reel is cut into individual sections using a cutting or punching technique, and each of these individual sections is then bonded to a support member. Subsequently, a semiconductor element that has undergone singulation by dicing is die bonded to the support member via the film-like adhesive on the surface of the support member. Production of the semiconductor device is then completed by conducting a wire bonding step and a sealing step (for example, see Japanese Patent Laid-Open No. H09-17810). However, in the case of individual bonding methods, because a dedicated assembly device is required for cutting the film-like adhesive and bonding each individual section to a support member, the production costs are more expensive than systems that use silver paste.

On the other hand, in wafer backside laminating methods, the film-like adhesive is first laminated to the backside of a semiconductor wafer, and a dicing tape is then laminated to the bonded film-like adhesive. Subsequently, by conducting singulation by dicing the semiconductor wafer, semiconductor elements with an attached film-like adhesive are obtained, and each of these elements is then picked up and die bonded to a support member. Production of the semiconductor device is completed by conducting a wire bonding step and a sealing step. In the case of this type of wafer backside laminating method, a dedicated assembly device for cutting the film-like adhesive and bonding each individual section to a support member is not required. This means that bonding can be conducted either by using a conventional silver paste assembly apparatus without modification, or by using a conventional apparatus that has undergone partial modifications such as the addition of a hotplate. As a result, this system is attracting considerable attention as an assembly method that uses a film-like adhesive and yet offers comparatively low production costs (for example, see Japanese Patent Laid-Open No. H04-196246).

However, recently, the quantity of so-called 3D package semiconductor devices, in which a plurality of semiconductor elements are stacked on top of a support member in order to increase the functionality of the device, has increased rapidly. Even with these 3D package semiconductor devices, because reductions in the thickness of the overall semiconductor device are still sought, further reductions in the thickness of semiconductor wafers continue to occur.

As semiconductor wafers become ever thinner, even in the production of semiconductor devices using the above type of wafer backside laminating methods, the occurrence of wafer breakage during transport of the semiconductor wafer or during the laminating of the film-like adhesive to the backside of the semiconductor wafer is becoming increasingly problematic. Accordingly, in order to prevent such wafer breakage, a technique in which a polyolefin-based protective tape (a backgrind tape) is laminated to the surface of the semiconductor wafer is now widely employed.

However, because the softening temperature of the backgrind tape is typically low (for example, no higher than 100° C.), in those cases where a backgrind tape is used, a film-like adhesive that is capable of being laminated to the semiconductor wafer backside at a temperature lower than the softening temperature (for example, 100° C.) is required. Furthermore, as semiconductor wafers become thinner, warping of the semiconductor wafer as a result of thermal stress becomes increasingly likely, and suppression of this warping also demands the use of a film-like adhesive that is capable of being laminated at as low a temperature as possible.

In this manner, the properties demanded of film-like adhesives include those properties that ensure favorable processability during the production of a semiconductor device, such as favorable bonding properties at low temperatures. In addition, in order to ensure favorable reliability for the semiconductor device, the film-like adhesive also requires satisfactory reflow resistance.

A film-like adhesive comprising a combination of a thermoplastic resin with a comparatively low glass transition temperature and a thermosetting resin has already been proposed as an adhesive that combines favorable processability and reflow resistance (for example, see Japanese Patent Publication No. 3,014,578).

DISCLOSURE OF INVENTION

However, with conventional film-like adhesives, the adhesive strength upon heating tends to decrease as the Tg value of the thermoplastic resin used decreases, and even when combined with a thermosetting resin, there is a limit to the level of improvement that can be achieved in the properties of the adhesive. Further improvements are required in order to achieve a superior combination of processability and reflow resistance.

The present invention addresses the above problems associated with the conventional technology, and has an object of providing a film-like adhesive capable of achieving a superior combination of processability, such as a favorable low-temperature bonding property, and semiconductor device reliability such as a favorable level of reflow resistance. Furthermore, another object of the present invention is to provide an adhesive sheet that enables a simplification of semiconductor device production. Moreover, yet another object of the present invention is to provide a semiconductor device with excellent adhesive strength upon heating and excellent humidity resistance.

As a result of intensive investigation aimed at achieving the above objects, the inventors of the present invention developed the following aspects of the present invention.

Namely, the present invention relates to a film-like adhesive used for bonding a semiconductor element to an adherend, having an adhesive layer comprising at least one resin selected from the group consisting of polyurethaneimide resins, polyurethaneamideimide resins and polyurethaneimide-polyurethaneamideimide resins.

According to one embodiment of the present invention, the adhesive layer preferably comprises a polyurethaneimide resin, and the polyurethaneimide resin preferably comprises a polymer having a partial structure represented by a formula (1a) shown below:

[Formula 1]

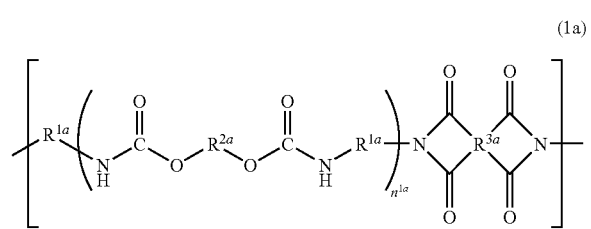

(1a)

[wherein, $R^{1a}$ represents a bivalent organic group containing either an aromatic ring, or a straight-chain, branched or cyclic aliphatic hydrocarbon, $R^{2a}$ represents a bivalent organic group with a molecular weight within a range from 100 to 10,000, $R^{3a}$ represents a tetravalent organic group containing a total number of carbon atoms of 4 or greater, and $n^{1a}$ represents an integer from 1 to 100].

The above polyurethaneimide resin is preferably produced by subjecting a urethane oligomer having isocyanate groups at the terminals, generated by a reaction between a diisocyanate and a diol, to a chain extension using a tetracarboxylic dianhydride.

Furthermore, according to another embodiment of the present invention, the adhesive layer preferably comprises a polyurethaneamideimide resin, and the polyurethaneamideimide resin preferably comprises a polymer having a partial structure represented by a formula (1b) shown below:

[Formula 2]

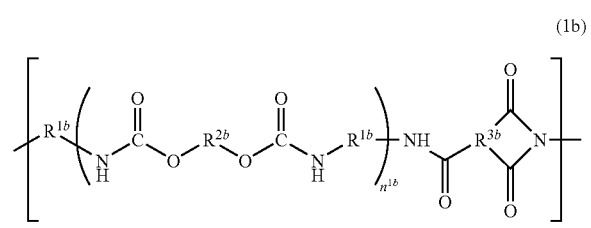

(1b)

[wherein, $R^{1b}$ represents a bivalent organic group containing either an aromatic ring, or a straight-chain, branched or cyclic aliphatic hydrocarbon, $R^{2b}$ represents a bivalent organic group with a molecular weight within a range from 100 to 10,000, $R^{3b}$ represents a trivalent organic group containing a total number of carbon atoms of 4 or greater, and $n^{1b}$ represents an integer from 1 to 100].

The above polyurethaneamideimide resin can be produced by subjecting a urethane oligomer having isocyanate groups at the terminals, generated by a reaction between a diisocyanate and a diol, to a chain extension using a tricarboxylic anhydride.

Furthermore, according to yet another embodiment of the present invention, the adhesive layer preferably comprises a polyurethaneimide-polyurethaneamideimide resin, the polyurethaneimide-polyurethaneamideimide resin preferably comprises a polymer having a partial structure represented by a formula (1a) shown below, and the polyurethaneimide-polyurethaneamideimide resin preferably also comprises a polymer having a partial structure represented by a formula (1b) shown below:

[Formula 3]

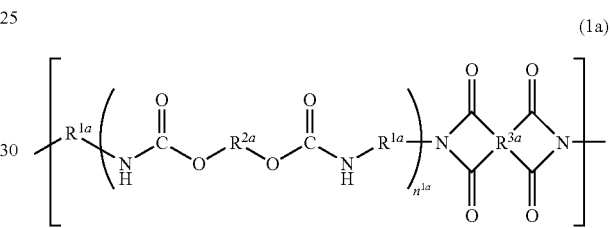

(1a)

[wherein, $R^{1a}$ represents a bivalent organic group containing either an aromatic ring, or a straight-chain, branched or cyclic aliphatic hydrocarbon, $R^{2a}$ represents a bivalent organic group with a molecular weight within a range from 100 to 10,000, $R^{3a}$ represents a tetravalent organic group containing a total number of carbon atoms of 4 or greater, and $n^{1a}$ represents an integer from 1 to 100]

[Formula 4]

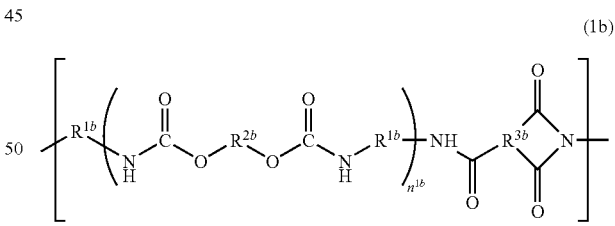

(1b)

[wherein, $R^{1b}$ represents a bivalent organic group containing either an aromatic ring, or a straight-chain, branched or cyclic aliphatic hydrocarbon, $R^{2b}$ represents a bivalent organic group with a molecular weight within a range from 100 to 10,000, $R^{3b}$ represents a trivalent organic group containing a total number of carbon atoms of 4 or greater, and $n^{1b}$ represents an integer from 1 to 100].

The above polyurethaneimide-polyurethaneamideimide resin can be produced by subjecting a urethane oligomer having isocyanate groups at the terminals, generated by a reaction between a diisocyanate and a diol, to a chain extension using a tetracarboxylic dianhydride and a tricarboxylic anhydride.

The aforementioned diisocyanate preferably comprises a compound represented by a formula (10) shown below.

[Formula 5]

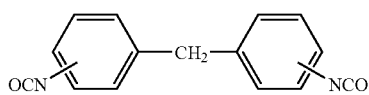

(10)

The aforementioned diol preferably comprises a compound represented by a formula (20) shown below.

[Formula 6]

(20)

[wherein, $n^{20}$ represents an integer from 1 to 100]

The aforementioned tetracarboxylic dianhydride preferably comprises a compound represented by a formula (30) shown below.

[Formula 7]

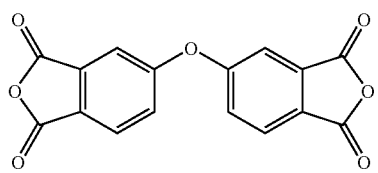

(30)

The aforementioned tricarboxylic anhydride preferably comprises a compound represented by a formula (40) shown below.

[Formula 8]

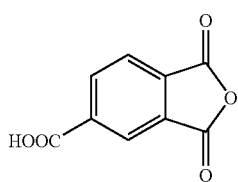

(40)

The weight average molecular weights of the polyurethaneimide resin, the polyurethaneamideimide resin, and the polyurethanimide-polyurethaneamideimide resin described above are preferably each within a range from 10,000 to 300,000.

The adhesive layer may also comprise a thermosetting resin, and the thermosetting resin preferably comprises an epoxy resin.

Furthermore, the adhesive layer may also comprise a filler.

In a film-like adhesive of the present invention, the main dispersion peak temperature for the adhesive layer in a dynamic viscoelasticity measurement is preferably within a range from −100 to 50° C., and the storage elastic modulus at 20° C. for the adhesive layer in the dynamic viscoelasticity measurement is preferably no more than 1,000 MPa.

Furthermore, the flow amount for the adhesive layer when subjected to pressurization at 9.8 MPa for 90 seconds while being heated at 180° C. is preferably within a range from 50 to 2,000 μm.

In addition, the flow amount for the adhesive layer when heated for one hour at 180° C., and subsequently subjected to pressurization at 9.8 MPa for 90 seconds while being heated at 180° C. is preferably within a range from 50 to 2,000 μm.

In the present invention, a wired organic substrate can be used as the adherend to which the semiconductor element is bonded.

Furthermore, the present invention also relates to an adhesive sheet comprising a dicing sheet with a pressure-sensitive adhesive layer provided on one surface of a substrate film, and the aforementioned film-like adhesive provided on the pressure-sensitive adhesive layer. The pressure-sensitive adhesive layer is preferably formed using a radiation-curable pressure-sensitive adhesive.

Moreover, the present invention also relates to a semiconductor device with at least one semiconductor element mounted on a support member, wherein the die bonding layer used for bonding together the support member and the semiconductor element is a die bonding layer formed using the aforementioned film-like adhesive.

Furthermore, the present invention also relates to a semiconductor device with at least two semiconductor elements mounted on a support member, wherein at least one of the die bonding layer used for bonding together the support member and a semiconductor element, and the die bonding layer used for bonding together the two semiconductor elements, is a die bonding layer formed using the aforementioned film-like adhesive.

The disclosures of the present application relate to subject matter described in Japanese Patent Application No. 2005-030759 filed on Feb. 7, 2005, Japanese Patent Application No. 2005-043135 filed on Feb. 18, 2005, Japanese Patent Application No. 2005-043139 filed on Feb. 18, 2005 and Japanese Patent Application No. 2005-049407 filed on Feb. 24, 2005, and the contents of the disclosures therein are incorporated herein by reference.

BRIEF DESCRIPTION OF THE DRAWINGS

FIG. 10 is a cross-sectional view showing a method used for measuring peel strength in the examples.

BEST MODE FOR CARRYING OUT THE INVENTION

As follows is a detailed description of preferred embodiments of the present invention, with reference to the drawings as required. However, the present invention is in no way limited by the embodiments presented below. A film-like adhesive of the present invention is an adhesive that is used for bonding a semiconductor element to an adherend such as a support member for mounting a semiconductor element, namely, an adhesive that is used for die bonding.

Figure 1:
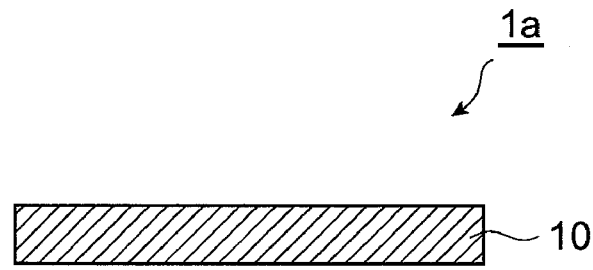
FIG. 1 is a cross-sectional view showing an embodiment of a film-like adhesive according to the present invention.
Figure 2:
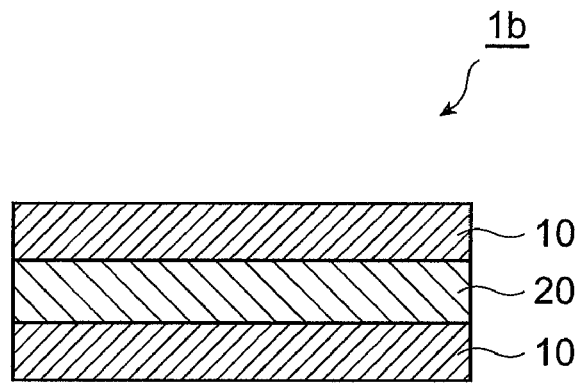
FIG. 2 is a cross-sectional view showing another embodiment of a film-like adhesive according to the present invention.

FIG. 1 and FIG. 2 are cross-sectional views showing embodiments of a film-like adhesive according to the present invention. The film-like adhesive 1a shown in FIG. 1a comprises a film-like adhesive layer 10 formed from a resin comprising at least one resin selected from the group consisting of polyurethaneimide resins, polyurethaneamideimide resins and polyurethaneimide-polyurethaneamideimide resins. The adhesive layer 10 may also comprise two or more resins selected from the group consisting of polyurethaneimide resins, polyurethaneamideimide resins and polyurethaneimide-polyurethaneamideimide resins. Furthermore, the adhesive layer 10 may comprise either a single polyurethaneimide resin, polyurethaneamideimide resins and/or polyurethaneimide-polyurethaneamideimide resin, or two or more different varieties of any of the respective resin types.

The thickness of the adhesive layer 10 is preferably within a range from approximately 5 to 100 μm. Furthermore, when storing or transporting the film-like adhesive 1a, the adhesive is preferably converted to a tape-like form with a width of approximately 1 to 20 mm or a sheet-like form with a width of approximately 10 to 50 cm, and then wound around a winding core.

The film-like adhesive 1b shown in FIG. 2 comprises the same adhesive layer 10 as the film-like adhesive 1a of FIG. 1, which is formed on both surfaces of a substrate film 20.

There are no particular restrictions on the substrate film 20, provided it is able to withstand the heat applied during the formation of the adhesive layer 10, and ideal examples of materials that can be used include polyester films, polypropylene films, polyethylene terephthalate films, polyimide films, polyetherimide films, polyether naphthalate films, and methylpentene films. The substrate film 20 may also be a multilayered film comprising a combination of two or more of these films. Furthermore, the surfaces of the substrate film 20 may be treated with a release agent such as a silicone-based release agent.

In the film-like adhesives 1a and 1b, a cover film that covers the adhesive layer 10 may also be provided to prevent damage and contamination of the adhesive layer 10. In such a case, the cover film is removed from the film-like adhesive prior to die bonding.

The adhesive layer 10 comprises at least one resin selected from the group consisting of polyurethaneimide resins, polyurethaneamideimide resins and polyurethaneimide-polyurethaneamideimide resins. "Polyurethaneimide resins" refer to resins comprising a polymer that has urethane groups and imide groups within the principal chain. "Polyurethaneamideimide resins" refer to resins comprising a polymer that has urethane groups, amide groups and imide groups within the principal chain. "Polyurethaneimide-polyurethaneamideimide resins" refer to resins comprising a polymer that has a partial structure that has urethane groups and imide groups within the principal chain, and a partial structure that has urethane groups, amide groups and imide groups within the principal chain. By incorporating urethane groups, imide groups, and in some cases amide groups, the adhesive layer 10 is able to combine superior processability with superior reflow resistance. Hereafter, the combination of "polyurethaneimide resins, polyurethaneamideimide resins and polyurethaneimide-polyurethaneamideimide resins" may also be abbreviated using the generic term "polyurethaneimide-series resin".

By including at least one resin selected from the group consisting of polyurethaneimide resins, polyurethaneamideimide resins and polyurethaneimide-polyurethaneamideimide resins, the adhesive layer 10 is able to provide a film-like adhesive with excellent processability, including superior low-temperature bonding properties. Furthermore, at reflow heating temperatures of approximately 260° C., the adhesive layer 10 is able to provide a film-like adhesive with superior adhesive strength that is able to inhibit peeling or breakdown of the die bonding layer.

Furthermore, conventionally, in those cases where the support member for mounting the semiconductor element possesses an uneven surface as a result of level differences caused by wiring, such as the case of a wired organic substrate in which the surface of the substrate has been wired, the die bonding layer needed to adequately fill (embed) the indentations within the uneven surface. This filling is extremely important in ensuring the reliability of the humidity resistance of the semiconductor device, and the reliability of the insulation between wiring sections. Typically, during the assembly process for the semiconductor device, the heat and pressure applied during transfer molding of the sealing material causes the die bonding layer to flow, thereby filling the indentations within the support member surface.

However, especially in the production of the aforementioned type of 3D package semiconductor devices, the die bonding layer disposed between the lowest level semiconductor element and the support member (hereafter referred to as the "lowest die bonding layer") accumulates a great deal of heat history prior to the conducting of transfer molding. As a result, the fluidity of the lowest die bonding layer deteriorates, meaning the ability of the layer to fill indentations within the mounting substrate surface can no longer be assured. In other words, when a plurality of semiconductor elements are stacked on top of a support member, heating is conducted over many repetitions in order to effect die bonding of each of the semiconductor elements, but as the number of semiconductor elements increases, the heat history accumulated by the die bonding layers increases. As a result, hardening of the die bonding layers occurs, meaning the fluidity of the lowest die bonding layer is prone to deterioration by the time the transfer molding stage is reached.

Furthermore, in the case of conventional film-like adhesives, if a material is used that exhibits large fluidity even when heat history is accumulated over an extended period, as is the case in the production of 3D package semiconductor devices, then voids within the die bonding layer tend to become more prevalent. If large numbers of voids are generated within the die bonding layer, then the reflow resistance, the reliability of the humidity resistance, and the reliability of the insulation between wiring sections of the semiconductor device all deteriorate.

By including at least one resin selected from the group consisting of polyurethaneimide resins, polyurethaneamideimide resins and polyurethaneimide-polyurethaneamideimide resins, the adhesive layer 10 is able to satisfactorily fill any indentations within the support member surface upon the heating conducted during transfer molding of the sealing material, even after having accumulated significant heat history. The occurrence of voids within the die bonding layer can also be satisfactorily suppressed. From the viewpoints of the level of fluidity during transfer molding, and the occurrence of voids, the adhesive layer 10 preferably comprises at least one resin selected from polyurethaneimide resins and polyurethaneimide-polyurethaneamideimide resins.

The reasons that use of a polyurethaneimide-series resin yields the effects of the present invention are not entirely clear. The inventors of the present invention surmise that the effects are due to the fact that when a film comprising a polyurethaneimide-series resin is heated to a temperature at least as high as the glass transition temperature, the resin develops adequate fluidity for filling the indentations within the support member surface, but does not develop the type of excessive fluidity that would cause the generation of voids within the die bonding layer. Generally, when a film comprising a thermoplastic resin as the primary component is pressurized while heating to a temperature at least as high the glass transition temperature, the film becomes very fluid as a result of micro-Brownian motion of the molecular chains within the thermoplastic resin. On the other hand, in the case of a film comprising a polyurethaneimide-series resin formed from a polymer that contains urethane groups, because these urethane groups exhibit comparatively high polarity and hydrogen bonding properties, the molecular chains tend to attract each other via interactions such as hydrogen bonding between urethane groups within the resin, thereby generating aggregates between multiple molecular chains. As a result, it is thought that in films that comprise a polyurethaneimide-series resin, the fluidity at temperatures exceeding the glass transition temperature is inhibited to some extent. It is thought that, as a result, when a film comprising a polyurethaneimide-series resin is heated to a temperature at least as high as the glass transition temperature, it exhibits the type of appropriate fluidity described above. In addition, in those cases where the polyurethaneimide-series resin comprises a polymer containing urethane groups and amide groups, interactions between amide groups and interactions between amide groups and urethane groups can also be expected.

In the case of typical polyimide-series resins that contain no urethane groups, the types of molecular chain interactions described above are either unlikely, or if they do occur, are weak. Consequently, it is thought that the fluidity of these resins at temperatures equal to, or greater than, the glass transition temperature becomes excessively large, increasing the likelihood of void problems occurring within the die bonding layer.

Preferred embodiments of the polyurethaneimide-series resins, namely, the polyurethaneimide resins, polyurethaneamideimide resins and polyurethaneimide-polyurethaneamideimide resins are described below. By employing these embodiments, the effects described above manifest even more markedly.

[Polyurethaneimide Resin]

The polyurethaneimide resin preferably comprises a polymer (a block copolymer) composed mainly of a partial structure represented by a formula (1a) shown below.

[Formula 9]

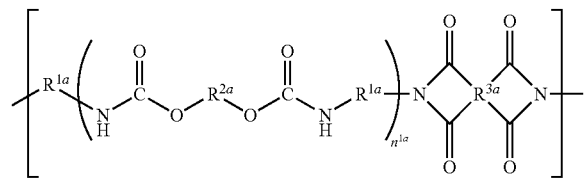

(1a)

In the formula (1a), $n^{1a}$ represents an integer from 1 to 100. This type of block copolymer can be obtained, for example, by subjecting a urethane oligomer having isocyanate groups at the terminals, generated by a reaction between a diisocyanate having two isocyanate groups and a diol having two hydroxyl groups, to a chain extension using a tetracarboxylic dianhydride.

In the formula (1a), $R^{1a}$ represents a bivalent organic group containing either an aromatic ring, or a straight-chain, branched or cyclic aliphatic hydrocarbon. $R^{1a}$ may also include both an aromatic ring and an aliphatic hydrocarbon. Those cases in which $R^{1a}$ contains an aromatic ring are particularly preferred. The plurality of $R^{1a}$ groups within the formula (1a) may be either the same or different.

Examples of $R^{1a}$ include a benzene residue, toluene residue, xylene residue, naphthalene residue, a straight-chain, branched or cyclic alkylene group, or a mixture of these groups, although a xylene residue or diphenylmethane residue is preferred.

Specifically, the $R^{1a}$ group is preferably a bivalent group introduced into the polymer by the reaction between the diisocyanate, and the polyol and acid anhydride described below. Examples of this diisocyanate include diphenylmethane-4,4'-diisocyanate, diphenylmethane-2,4'-diisocyanate, toluene-2,4-diisocyanate, toluene-2,6-diisocyanate, 1,6-hexamethylene diisocyanate, 3-isocyanatomethyl-3,5,5-trimethylcyclohexyl isocyanate, 1,1'-methylenebis(4-isocyanatocyclohexane), 1,3-bis(isocyanatomethyl)benzene, and 1,3-bis(isocyanatomethyl)cyclohexane.

Of these, bivalent groups derived from compounds represented by the formula (10) (including diphenylmethane-4,4'-diisocyanate and diphenylmethane-2,4'-diisocyanate) are preferred. Compounds represented by the formula (10) are preferred because they yield polyurethaneimide resins with superior heat resistance. Furthermore, because the reactivity between the monomers used in the synthesis of the urethane oligomer is high, the polyurethaneimide resin is obtained more efficiently, and control of the molecular weight of the polyurethaneimide resin is also easier.

[Formula 10]

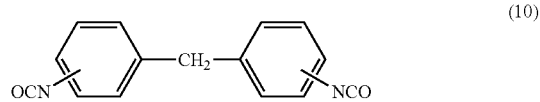

(10)

In the formula (1a), $R^{2a}$ represents a bivalent organic group with a molecular weight within a range from 100 to 10,000, and the plurality of $R^{2a}$ groups within the formula (1a) may be either the same or different.

Examples of $R^{2a}$ include a polyether residue, polyester residue, polycarbonate residue, polycaprolactone residue and polysiloxane residue, and of these, a polyether residue is preferred.

The $R^{2a}$ group is introduced into the polymer, for example, by reaction of a diol with an average molecular weight of 100 to 10,000, and the aforementioned diisocyanate. Examples of this diol include polypropylene glycol, polyethylene glycol, polypropylene glycol/polyethylene glycol copolymers, polytetramethylene glycol, poly(ethylene adipate), poly(diethylene adipate), poly(polypropylene adipate), poly(tetramethylene adipate), poly(hexamethylene adipate), poly(neopentylene adipate), poly(hexamethylene sebacate), poly-ε-caprolactone, poly(hexamethylene carbonate), and poly(siloxane).

Amongst these, bivalent groups derived from polytetramethylene glycol represented by the formula (20) are preferred. Polytetramethylene glycol represented by the formula (20) yields superior heat resistance and humidity resistance reliability for the semiconductor device, and is consequently preferred. Furthermore, a film-like adhesive with even more superior low-temperature bonding properties and low stress properties can be obtained.

[Formula 11]

(20)

The ratio between the diisocyanate and the diol when producing the urethane oligomer preferably supplies a quantity of the diol within a range from 0.1 to 1.0 mols for every 1.0 mols of the diisocyanate.

In the formula (1a), $R^{3a}$ represents a tetravalent organic group containing a total number of carbon atoms of 4 or greater, and the plurality of $R^{3a}$ groups within the formula (1a) may be either the same or different.

Examples of $R^{3a}$ include an aromatic ring residue, a straight-chain, branched or cyclic aliphatic hydrocarbon residue, as well as an ether residue, thioether residue, carbonyl residue, sulfonyl residue, silane residue and ester residue, and of these, an ether residue is preferred.

The $R^{3a}$ group is introduced into the polymer, for example, by reaction of a tetracarboxylic dianhydride with the urethane oligomer having isocyanate groups at the terminals. Examples of this tetracarboxylic dianhydride include pyromellitic dianhydride, 3,3',4,4'-diphenyltetracarboxylic dianhydride, 2,2',3,3'-diphenyltetracarboxylic dianhydride, 4,4'-oxydiphthalic anhydride, 2,2-bis(3,4-dicarboxyphenyl) propane dianhydride, 2,2-bis(2,3-dicarboxyphenyl)propane dianhydride, 1,1-bis(2,3-dicarboxyphenyl)ethane dianhydride, 1,1-bis(3,4-dicarboxyphenyl)ethane dianhydride, bis (2,3-dicarboxyphenyl)methane dianhydride, bis(3,4-dicarboxyphenyl)methane dianhydride, bis(3,4-dicarboxyphenyl) sulfone dianhydride, 3,4,9,10-perylenetetracarboxylic dianhydride, bis(3,4-dicarboxyphenyl)ether dianhydride, benzene-1,2,3,4-tetracarboxylic dianhydride, 3,3',4,4'-benzophenonetetracarboxylic dianhydride, 2,2',3,3'-benzophenonetetracarboxylic dianhydride, 2,3,3',4'-benzophenonetetracarboxylic dianhydride, 1,2,5,6-naphthalenetetracarboxylic dianhydride, 2,3,6,7-naphthalenetetracarboxylic dianhydride, 1,2,4,5-naphthalenetetracarboxylic dianhydride, 1,4,5,8-naphthalenetetracarboxylic dianhydride, 2,6-dichloronaphthalene-1,4,5,8-tetracarboxylic dianhydride, 2,7-dichloronaphthalene-1,4,5,8-tetracarboxylic dianhydride, 2,3,6,7-tetrachloronaphthalene-1,4,5,8-tetracarboxylic dianhydride, phenanthrene-1,8,9,10-tetracarboxylic, pyrazine-2,3,5,6-tetracarboxylic dianhydride, thiophene-2,3, 4,5-tetracarboxylic dianhydride, 2,3,3',4'-biphenyltetracarboxylic dianhydride, 3,3',4,4'-biphenyltetracarboxylic dianhydride, 2,2',3,3'-biphenyltetracarboxylic dianhydride, bis(3, 4-dicarboxyphenyl)dimethylsilane dianhydride, bis(3,4-dicarboxyphenyl)methylphenylsilane dianhydride, bis(3,4-dicarboxyphenyl)diphenylsilane dianhydride, 1,4-bis(3,4-dicarboxyphenyldimethylsilyl)benzene dianhydride, 1,3-bis (3,4-dicarboxyphenyl)-1,1,3,3-tetramethyldicyclohexane dianhydride, p-phenylbis(trimellitic acid monoester anhydride), ethylenetetracarboxylic dianhydride, 1,2,3,4-butanetetracarboxylic dianhydride, decahydronaphthalene-1,4,5,8-tetracarboxylic dianhydride, 4,8-dimethyl-1,2,3,5,6,7-hexahydronaphthalene-1,2,5,6-tetracarboxylic dianhydride, cyclopentane-1,2,3,4-tetracarboxylic dianhydride, pyrrolidine-2,3,4,5-tetracarboxylic dianhydride, 1,2,3,4-cyclobutanetetracarboxylic dianhydride, bis(exo-bicyclo[2,2,1]heptane-2,3-dicarboxylic anhydride)sulfone, bicyclo[2,2,2]-octo[7]-ene-2,3,5,6-tetracarboxylic dianhydride, 2,2-bis(3, 4-dicarboxyphenyl)hexafluoropropane dianhydride, 2,2-bis [4-(3,4-dicarboxyphenoxy)phenyl]hexafluoropropane dianhydride, 4,4'-bis(3,4-dicarboxyphenoxy)diphenyl sulfide dianhydride, 1,4-bis(2-hydroxyhexafluoroisopropyl) benzenebis(trimellitic anhydride), 1,3-bis(2-hydroxyhexafluoroisopropyl)benzenebis(trimellitic anhydride), 5-(2, 5-dioxotetrahydrofuryl)-3-methyl-3-cyclohexene-1,2-dicarboxylic dianhydride, tetrahydrofuran-2,3,4,5-tetracarboxylic dianhydride, 1,2-(ethylene)bis(trimellitate anhydride), 1,3-(trimethylene)bis(trimellitate anhydride), 1,4-(tetramethylene)bis(trimellitate anhydride), 1,5-(pentamethylene)bis(trimellitate anhydride), 1,6-(hexamethylene)bis(trimellitate anhydride), 1,7-(heptamethylene)bis(trimellitate anhydride), 1,8-(octamethylene)bis(trimellitate anhydride), 1,9-(nonamethylene)bis(trimellitate anhydride), 1,10-(decamethylene)bis(trimellitate anhydride), 1,12-(dodecamethylene)bis(trimellitate anhydride), 1,16-(hexadecamethylene)bis(trimellitate anhydride), 1,18-(octadecamethylene)bis(trimellitate anhydride), and 4,4'-(4,4'-isopropylidenediphenoxy)bis(phthalic anhydride).

Of these, groups derived from 4,4'-oxydiphthalic anhydride represented by the formula (30) are preferred. The 4,4'-oxydiphthalic anhydride represented by the formula (30) yields superior humidity resistance reliability and heat resistance for the semiconductor device, and is consequently preferred.

[Formula 12]

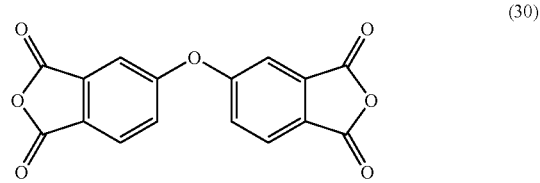

(30)

The ratio between the polyurethane oligomer and the tetracarboxylic dianhydride when producing the polyurethane-imide resin preferably supplies a quantity of the tetracarboxylic dianhydride within a range from 0.1 to 2.0 mols for every 1.0 mols of the polyurethane oligomer.

[Polyurethaneamideimide Resin]

The polyurethaneamideimide resin preferably comprises a polymer (a block copolymer) composed mainly of a partial structure represented by a formula (1b) shown below.

[Formula 13]

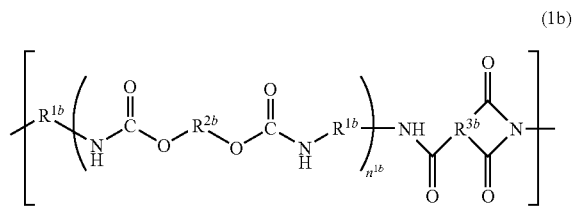

(1b)

In the formula (1b), $n^{1b}$ represents an integer from 1 to 100. This type of block copolymer can be obtained, for example, by subjecting a urethane oligomer having isocyanate groups at the terminals, generated by a reaction between a diisocyanate having two isocyanate groups and a diol having two hydroxyl groups, to a chain extension using a tricarboxylic anhydride.

In the formula (1b), $R^{1b}$ represents a bivalent organic group containing either an aromatic ring, or a straight-chain, branched or cyclic aliphatic hydrocarbon. $R^{1b}$ may also include both an aromatic ring and an aliphatic hydrocarbon. Those cases in which $R^{1b}$ contains an aromatic ring are particularly preferred. The plurality of $R^{1b}$ groups within the formula (1b) may be either the same or different.

Examples of $R^{1b}$ include a benzene residue, toluene residue, xylene residue, naphthalene residue, a straight-chain, branched or cyclic alkylene group, or a mixture of these groups, although a xylene residue or diphenylmethane residue is preferred.

Specifically, the $R^{1b}$ group is preferably a bivalent group introduced into the polymer by the reaction between the diisocyanate, and the polyol and acid anhydride described below. Examples of this diisocyanate include diphenylmethane-4,4'-diisocyanate, diphenylmethane-2,4'-diisocyanate, toluene-2,4-diisocyanate, toluene-2,6-diisocyanate, 1,6-hexamethylene diisocyanate, 3-isocyanatomethyl-3,5,5-trimethylcyclohexyl isocyanate, 1,1'-methylenebis(4-isocyanatocyclohexane), 1,3-bis(isocyanatomethyl)benzene, and 1,3-bis(isocyanatomethyl)cyclohexane.

Of these, bivalent groups derived from compounds represented by the formula (10) (including diphenylmethane-4,4'-diisocyanate and diphenylmethane-2,4'-diisocyanate) are preferred. Compounds represented by the formula (10) are preferred because they yield polyurethaneamideimide resins with superior heat resistance. Furthermore, because the reactivity between the monomers used in the synthesis of the urethane oligomer is high, the polyurethaneamideimide resin is obtained more efficiently, and control of the molecular weight of the polyurethaneamideimide resin is also easier.

[Formula 14]

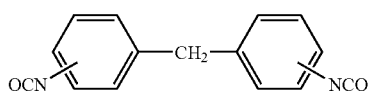

(10)

In the formula (1b), $R^{2b}$ represents a bivalent organic group with a molecular weight within a range from 100 to 10,000, and the plurality of $R^{2b}$ groups within the formula (1b) may be either the same or different.

Examples of $R^{2b}$ include a polyether residue, polyester residue, polycarbonate residue, polycaprolactone residue and polysiloxane residue, and of these, a polyether residue is preferred.

The $R^{2b}$ group is introduced into the polymer, for example, by reaction of a diol with an average molecular weight of 100 to 10,000, and the aforementioned diisocyanate. Examples of this diol include polypropylene glycol, polyethylene glycol, polypropylene glycol/polyethylene glycol copolymers, polytetramethylene glycol, poly(ethylene adipate), poly(diethylene adipate), poly(polypropylene adipate), poly(tetramethylene adipate), poly(hexamethylene adipate), poly(neopentylene adipate), poly(hexamethylene sebacate), poly-ε-caprolactone, poly(hexamethylene carbonate), and poly(siloxane).

Amongst these, bivalent groups derived from polytetramethylene glycol represented by the formula (20) are preferred. Polytetramethylene glycol represented by the formula (20) yields superior heat resistance and humidity resistance reliability for the semiconductor device, and is consequently preferred. Furthermore, a film-like adhesive with even more superior low-temperature bonding properties and low stress properties can be obtained.

[Formula 15]

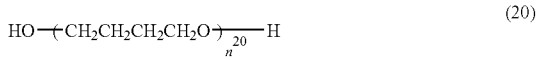

(20)

The ratio between the diisocyanate and the diol when producing the urethane oligomer preferably supplies a quantity of the diol within a range from 0.1 to 1.0 mols for every 1.0 mols of the diisocyanate.

In the formula (1b), $R^{3b}$ represents a trivalent organic group containing a total number of carbon atoms of 4 or greater, and the plurality of $R^{3b}$ groups within the formula (1b) may be either the same or different.

Examples of $R^{3b}$ include an aromatic ring residue, a straight-chain, branched or cyclic aliphatic hydrocarbon residue, as well as an ether residue, thioether residue, carbonyl residue, sulfonyl residue, silane residue and ester residue, and of these, a benzene residue is preferred.

The $R^{3a}$ group is introduced into the polymer, for example, by reaction of a tricarboxylic anhydride with the urethane oligomer having isocyanate groups at the terminals. Examples of this tricarboxylic anhydride include trimellitic anhydride, butane-1,2,4-tricarboxylic anhydride, pentane-1,2,5-tricarboxylic anhydride, cyclohexane-1,2,3-tricarboxylic anhydride, cyclopentadienyl-3,4,4'-tricarboxylic anhydride, cyclopentadienyl-1,2,4-tricarboxylic anhydride, benzene-1,2,3-tricarboxylic anhydride, naphthalene-1,2,4-tricarboxylic anhydride, naphthalene-1,2,5-tricarboxylic anhydride, naphthalene-1,4,5-tricarboxylic anhydride, naphthalene-2,3,5-tricarboxylic anhydride, naphthalene-2,3,6-tricarboxylic anhydride, 3,4,4'-diphenyltricarboxylic anhydride, 2,3,2'-diphenyltricarboxylic anhydride, 3,4,3'-diphenylsulfonetricarboxylic anhydride, 3,4,4'-diphenyl ether tricarboxylic anhydride, 3,4,4'-benzophenonetricarboxylic anhydride, 3,3',4-benzophenonetricarboxylic anhydride, perylene-3,4,9-tricarboxylic anhydride, 2-(3,4-dicarboxyphenyl)-2-(3-carboxyphenyl)propane anhydride, 2-(2,3-dicarboxyphenyl)-2-(3-carboxyphenyl)propane anhydride, 1-(2,3-dicarboxyphenyl)-1-(3-carboxyphenyl)ethane anhydride, 1-(3,4-dicarboxyphenyl)-1-(4-carboxyphenyl)ethane anhydride, (2,3-dicarboxyphenyl)-(2-carboxyphenyl)methane anhydride, 2-(3',4'-dicarboxyphenyl)-5-(3'-carboxyphenyl)-1,3,4-oxadiazole anhydride, 2-(3',4'-dicarboxydiphenyl ether)-5-(4'-carboxydiphenyl ether)-1,3,4-oxadiazole anhydride, 2-(3',4'-dicarboxyphenyl)-5-carboxybenzoimidazole anhydride, 2-(3',4'-dicarboxyphenyl)-5-carboxybenzooxazole anhydride, 2-(3',4'-dicarboxyphenyl)-5-carboxybenzothiazole anhydride, and 2,3,5-pyridinetricarboxylic anhydride.

Of these, trifunctional groups derived from 1,2,4-benzenetricarboxylic 1,2-anhydride represented by the formula (40) are preferred. The 1,2,4-benzenetricarboxylic 1,2-anhydride represented by the formula (40) yields superior humidity resistance reliability for the semiconductor device, and is consequently preferred.

[Formula 16]

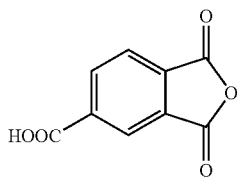

(40)

The ratio between the polyurethane oligomer and the tricarboxylic anhydride when producing the polyurethaneamideimide resin preferably supplies a quantity of the tricarboxylic anhydride within a range from 0.1 to 2.0 mols for every 1.0 mols of the polyurethane oligomer.

[Polyurethaneimide-Polyurethaneamideimide Resin]

The polyurethaneimide-polyurethaneamideimide resin preferably comprises a polymer (a block copolymer) composed mainly of a partial structure represented by the formula (1a) shown above, and a partial structure represented by the formula (1b) shown above.

This type of block copolymer can be obtained, for example, by subjecting a urethane oligomer having isocyanate groups at the terminals, generated by a reaction between a diisocyanate having two isocyanate groups and a diol having two hydroxyl groups, to a chain extension using a tetracarboxylic dianhydride and a tricarboxylic anhydride.

The ratio between the polyurethane oligomer and the combination of the tetracarboxylic dianhydride and tricarboxylic anhydride when producing the polyurethaneimide-polyurethaneamideimide resin preferably supplies a combined quantity of the tetracarboxylic dianhydride and tricarboxylic anhydride within a range from 0.1 to 2.0 mols for every 1.0 mols of the polyurethane oligomer.

The ratio between the tetracarboxylic dianhydride and the tricarboxylic anhydride, in the case where the combination of the two is 1.0 mols, preferably supplies from 0.05 to 0.95 mols of the tetracarboxylic dianhydride and from 0.05 to 0.95 mols of the tricarboxylic anhydride, and even more preferably supplies from 0.20 to 0.80 mols of the tetracarboxylic dianhydride and from 0.20 to 0.80 mols of the tricarboxylic anhydride. As the proportion of the tetracarboxylic dianhydride increases, the quantity of acid anhydride groups at the acid terminals of the polyurethaneimide-polyurethaneamideimide resin (the copolymer) increases. Furthermore, as the proportion of the tricarboxylic anhydride increases, the quantity of carboxyl groups at the acid terminals of the polyurethaneimide-polyurethaneamideimide resin (copolymer) increases. This is because during the chain extension of the urethane oligomer, acid anhydride groups exhibit a higher degree of reactivity with the isocyanate terminal groups of the urethane oligomer than carboxyl groups.

However, in those cases where the film-like adhesive also comprises a thermosetting resin, and this thermosetting resin contains an epoxy resin, reactivity with the epoxy resin is higher for the carboxyl groups than for the acid anhydride groups. Accordingly, as the proportion of the tetracarboxylic dianhydride increases, the polyurethaneimide-polyurethaneamideimide resin (copolymer) tends to develop more acid anhydride terminals, which exhibit a lower reactivity with the epoxy resin, meaning deterioration in the fluidity of the film-like adhesive caused by heat history can be suppressed. As a result, as the proportion of the tetracarboxylic dianhydride increases, the fluidity of the resulting adhesive tends to become more stable, even if the adhesive has accumulated heat history.

On the other hand, as the proportion of the tricarboxylic anhydride increases, the polyurethaneimide-polyurethaneamideimide resin (copolymer) tends to develop more carboxyl group terminals, which exhibit a higher reactivity with the epoxy resin. Consequently, deterioration in the fluidity of the film-like adhesive caused by heat history increases, although the cross-linking density also increases. Furthermore, large quantities of amide linkages, which contribute to the level of adhesiveness, exist within the principal chain of the polyurethaneimide-polyurethaneamideimide resin (copolymer). As a result, the adhesive strength of the resulting adhesive under high temperature tends to improve.

Based on the trends described above, the ratio between the tetracarboxylic dianhydride and the tricarboxylic anhydride can be determined with due consideration given to the characteristics required for the resulting adhesive.

When the tetracarboxylic dianhydride described above is measured using DSC, the endothermic peak derived from the melting point of the tetracarboxylic dianhydride preferably exhibits a difference between the endothermic start temperature and the endothermic peak temperature of no more than 10° C. This temperature difference can be viewed as an indicator of the purity of the tetracarboxylic dianhydride, and it is thought that the smaller this difference value is, the higher the purity level is for the tetracarboxylic dianhydride. Similarly, when the tricarboxylic anhydride described above is measured using DSC, the endothermic peak derived from the melting point of the tricarboxylic anhydride preferably exhibits a difference between the endothermic start temperature and the endothermic peak temperature of no more than 10° C. This temperature difference can be viewed as an indicator of the purity of the tricarboxylic anhydride, and it is thought that the smaller this difference value is, the higher the purity level is for the tricarboxylic anhydride. The endothermic start temperature and the endothermic peak temperature refer to values determined based on a DSC curve measured under a nitrogen atmosphere at a rate of temperature increase of 5° C./minute, using a sample size of approximately 5 mg. DSC measurement can be conducted, for example, using a DSC-7 device (product name) manufactured by PerkinElmer, Inc. Furthermore, prior to use, both the tetracarboxylic dianhydride and the tricarboxylic anhydride are preferably dried by heating for at least 12 hours at a temperature 10 to 20° C. below the respective melting points.

The polyurethaneimide-series resin can be produced by normal methods such as solution polymerization methods, using the monomers described above (for example, see reference documents 1 to 4).

(Reference Document 1): J. Appl. Polym. Sci., B. Jiang, J. Hao, W. Wang, L. Jiang and X. Cai, Vol. 81, p. 773, 2001.

(Reference Document 2): J. Appl. Polym. Sci., I. C. Kim, J. H. Kim, K. H. Lee and T. M. Tak, Vol. 86, p. 3502, 2002.

(Reference Document 3): Journal of the Society of Rubber Industry, Japan, Eisuke Yamada, Yukihiro Kato and Shinji Inagaki, Vol. 72, p. 74, 1999.

(Reference Document 4): Polymer International, Tzong-Liu Wang and Fang-Jung Huang, Vol. 46, pp. 280 to 284, 1998.

In the case of a solution polymerization method, first a reaction solution is prepared by dissolving the diisocyanate and the diol in a solvent such as N-methyl-2-pyrrolidone that is capable of dissolving the produced polyurethaneimide-series resin. Subsequently, the thus obtained reaction solution is heated at 50 to 200° C. for a period of 30 minutes to 5 hours, thereby generating a urethane oligomer. The tetracarboxylic dianhydride and/or tricarboxylic anhydride is then added to the reaction solution, and heating is continued at a temperature of 70 to 250° C. for a period of 1 to 10 hours, thus effecting a reaction between the isocyanate groups of the urethane oligomer and the acid anhydride groups or carboxyl groups of the acid anhydride. This reaction yields a polyurethaneimide-series resin. In this type of solution polymerization method, a tertiary amine or the like may also be added to the reaction solution as a catalyst. However, in those cases where the polyurethaneimide-series resin is combined with a thermosetting resin in the adhesive layer 10, the decisions as to whether or not to add a catalyst, and if added, the quantity used of such a catalyst, are preferably made with due consideration to the resulting fluidity during heating.

From the viewpoints of ease of film formation and fluidity during heating, the weight average molecular weight of the polyurethaneimide-series resin within the adhesive layer 10 is preferably within a range from 10,000 to 300,000. Furthermore, in order to raise the toughness of the adhesive layer 10, this weight average molecular weight is even more preferably within a range from 30,000 to 200,000, and is most preferably from 70,000 to 150,000. In this description, the above weight average molecular weight refers to a polystyrene-equivalent value measured by gel permeation chromatography (for example, using a C-R4A device manufactured by Shimadzu Corporation).

The temperature during lamination of a film-like adhesive of the present invention is preferably no higher than the heat resistance temperature or softening temperature of the backgrind tape, and is also preferably no higher than the heat resistance temperature or softening temperature of the dicing sheet. Furthermore, the temperature is preferably set to a value that enables suppression of warping of the semiconductor wafer. Specifically, the temperature during lamination is preferably within a range from 10 to 100° C., and even more preferably from 20 to 80° C. In order to enable lamination at these sorts of temperatures, the glass transition temperature (Tg) of the polyurethaneimide-series resin is preferably adjusted to a temperature within a range from −100 to 50° C., and even more preferably to a temperature from −80 to 30° C. If the Tg value exceeds 50° C., then the temperature required to achieve lamination of the film-like adhesive may exceed 100° C., whereas if the Tg value is less than −100° C., the handling properties of the film-like adhesive tend to deteriorate. The Tg value refers to a value determined based on a DSC curve measured under a nitrogen atmosphere at a rate of temperature increase of 5° C./minute, using a sample size of approximately 10 mg. DSC measurement can be conducted, for example, using a DSC-7 device (product name) manufactured by PerkinElmer, Inc.

In addition to the type of polyurethaneimide-series resin described above, the adhesive layer 10 preferably also comprises a thermosetting resin. In the present invention, a thermosetting resin refers to a resin formed from a cross-linking compound that undergoes cross-linking on heating. Examples of suitable thermosetting resins include epoxy resins, cyanate ester resins, bismaleimide resins, phenolic resins, urea resins, melamine resins, alkyd resins, acrylic resins, unsaturated polyester resins, diallyl phthalate resins, silicone resins, resorcinol formaldehyde resins, xylene resins, furan resins, polyurethane resins, ketone resins, triallyl cyanurate resins, polyisocyanate resins, resins containing tris(2-hydroxyethyl) isocyanurate, resins containing triallyl trimellitate, dicyclopentadiene resins, and thermosetting resins formed by trimerization of aromatic dicyanamides. Of these, in terms of increasing the adhesive strength at high temperatures, epoxy resins are preferred. These thermosetting resins may be used either alone, or in combinations of two or more different resins.

As the epoxy resin, the use of a resin containing at least two epoxy groups within each molecule is preferred. From the viewpoints of curability and the properties of the cured product, glycidyl ether-based epoxy resins are particularly desirable. Examples of glycidyl ether-based epoxy resins include diglycidyl ethers of bisphenols such as bisphenol A, bisphenol AD, bisphenol S and bisphenol F, the diglycidyl ether of hydrogenated bisphenol A, diglycidyl ethers of ethylene oxide adducts or propylene oxide adducts of bisphenol A, polyglycidyl ethers of phenol novolac resins, polyglycidyl ethers of cresol novolac resins, polyglycidyl ethers of bisphenol A novolac resins, diglycidyl ethers of naphthalenediols, and dicyclopentadiene-based epoxy resins. Examples of suitable epoxy resins besides the above glycidyl ethers include diglycidyl esters of dimer acid, trifunctional or tetrafunctional polygylcidylamines, and polygylcidylamines of naphthalene. The epoxy resin may be used either alone, or in a combination of two or more different resins.

In order to prevent electromigration and prevent corrosion of metal conductive circuits, the epoxy resin preferably employs a high-purity compound in which the quantities of impurities such as alkali metal ions, alkaline earth metal ions, halogen ions, chloride ions and hydrolyzable chlorine have been reduced. Epoxy resins in which the hydrolyzable chlorine content is no higher than 300 ppm are particularly desirable.

The quantity of the thermosetting resin within the adhesive layer 10 is preferably within a range from 0.01 to 200 parts by weight, and even more preferably from 0.1 to 100 parts by weight, per 100 parts by weight of the polyurethaneimide-series resin. If the quantity of the thermosetting resin is less than 0.01 parts by weight or greater than 200 parts by weight, then there is a tendency for the film-like adhesive to lose its favorable low out-gas properties, film-forming properties, toughness and heat resistance.

In those cases where a thermosetting resin is used, the adhesive layer 10 preferably also contains a thermosetting resin curing agent or catalyst. In such cases, a combination of a curing agent and a curing accelerator, or a catalyst and a catalyst assistant may also be used if required. The curing accelerator may be a compound that also functions as a curing agent. The quantity added of the curing agent and curing accelerator, or the need for such addition, is preferably determined with due consideration to factors such as the fluidity upon heating and the heat resistance following curing.

In those cases where an epoxy resin is used as the thermosetting resin, examples of suitable curing agents include phenol-based compounds, aliphatic amines, alicyclic amines, aromatic polyamines, polyamides, aliphatic acid anhydrides, alicyclic acid anhydrides, aromatic acid anhydrides, dicyandiamide, organic acid dihydrazides, boron trifluoride amine complexes, imidazoles, and tertiary amines. Of these, phenol-based compounds are preferred, and phenol-based compounds having at least two phenolic hydroxyl groups are particularly desirable. Examples of these phenol-based compounds include phenol novolac resins, cresol novolac resins, t-butylphenol novolac resins, dicyclopentadiene cresol novolac resins, dicyclopentadiene phenol novolac resins, xylylene-modified phenol novolac resins, naphthol-based compounds, trisphenol-based compounds, tetrakisphenol novolac resins, bisphenol A novolac resins, poly-p-vinylphenol resins, and phenol aralkyl resins. Furthermore, the number average molecular weight of these phenol-based compounds is preferably within a range from 400 to 1,500. Such molecular weights are preferred as they enable the generation of out-gas, which can cause contamination of the semiconductor element or device, to be effectively reduced during the heating that is conducted during assembly of the semiconductor device.

Examples of curing accelerators that can be used in combination with the phenol-based compound that functions as the curing agent include imidazoles, dicyandiamide derivatives, dicarboxylic acid dihydrazides, triphenylphosphine, tetraphenylphosphonium tetraphenylborate, 2-ethyl-4-methylimidazole tetraphenylborate, and 1,8-diazabicyclo[5.4.0]undecene-7-tetraphenylborate.

The adhesive layer 10 may also incorporate a filler. Examples of suitable fillers include metal fillers such as silver powder, gold powder, copper powder and nickel powder, non-metallic inorganic fillers such as alumina, aluminum hydroxide, magnesium hydroxide, calcium carbonate, magnesium carbonate, calcium silicate, magnesium silicate, calcium oxide, magnesium oxide, aluminum oxide, aluminum nitride, crystalline silica, amorphous silica, boron nitride, titanic, glass, iron oxide and ceramics, and organic fillers such as carbon and rubber-based fillers. Adhesive layers containing a filler can be formed using a varnish prepared by adding the filler to the other components such as the polyurethane-imide-series resin, and then using a suitable combination of dispersion devices such as a stone mill, three-roll mill and ball mill to mix the components together.

The fillers described above can be selected in accordance with the functions required. For example, metal fillers are added for the purposes of imparting conductivity, thermal conductivity and thixotropic properties to the film-like adhesive. Non-metallic inorganic fillers are added for the purposes of imparting thermal conductivity, low thermal expansion properties, and low moisture absorption properties to the film-like adhesive. Organic fillers are added for the purpose of imparting toughness and the like to the film-like adhesive. These metal fillers, non-metallic inorganic fillers and organic fillers may be used either alone, or in combinations of two or more different fillers. A filler comprising boron nitride is particularly preferred as it exhibits favorable dispersibility within resin varnishes, and imparts superior levels of insulation and adhesive strength upon heating.

The average particle size of the filler is preferably no more than 10 μm, and even more preferably 5 μm or smaller. Furthermore, the maximum particle size within the filler is preferably no more than 25 μm, and even more preferably 20 μm or smaller. If the average particle size exceeds 10 μm or the maximum particle size exceeds 25 μm, then the effect of the filler in improving toughness tends to weaken. The lower limit for the average particle size and maximum particle size is typically approximately 0.001 μm, and preferably approximately 0.01 μm.

The filler preferably has an average particle size of no more than 10 μm and a maximum particle size of no more than 25 μm. If a filler is used for which the maximum particle size is no more than 25 μm but the average particle size exceeds 10 μm, then the adhesive strength tends to deteriorate. Furthermore, in contrast, if a filler is used for which the average particle size is no more than 10 μm but the maximum particle size exceeds 25 μm, then the variation in adhesive strength increases as a result of the broader particle size distribution, and when a thin adhesive layer is formed, the surface tends to be rougher, causing a deterioration in the adhesive strength.

The average particle size and maximum particle size of the filler are measured using a scanning electron microscope (SEM), by determining the average particle size and maximum particle size upon measurement of the particle size of approximately 200 particles of the filler. An example of a suitable measurement method using a SEM is a method in which an adhesive layer (a die bonding layer) that has been heat cured (preferably by heating at 150 to 200° C. for 1 to 10 hours) is cut, and the cross-section is then inspected using the SEM.

The quantity used of the filler can be determined in accordance with the properties or functions required of the resulting adhesive. The quantity of the filler is preferably within a range from 1 to 50% by volume, even more preferably from 2 to 40% by volume, and most preferably from 5 to 30% by volume, of the entire adhesive layer 10. Increasing the elastic modulus of the adhesive layer by increasing the quantity of the filler is advantageous in terms of effectively improving the dicing properties (the cutting characteristics upon cutting with a dicing blade), the wire bonding properties (the ultrasound efficiency), and the adhesive strength upon heating. However, if the quantity of filler is increased excessively, then the low-temperature bonding properties and adhesive strength deteriorate, and the reliability of the adhesive including factors such as the reflow resistance also tends to worsen.

Any of the various coupling agents may also be added to the adhesive layer 10 in order to strengthen the interfacial bonding between different materials. Examples of suitable coupling agents include silane-based, titanium-based and aluminum-based coupling agents, and of these, silane-based coupling agents are preferred as they yield the largest effect. From the viewpoints of the level of interfacial bonding, the heat resistance and the cost, the quantity used of the coupling agent is preferably within a range from 0.01 to 20 parts by weight per 100 parts by weight of the polyurethaneimide-series resin.

Ion scavengers may also be added to the adhesive layer 10 in order to adsorb ionic impurities and improve the insulation reliability upon moisture absorption. Examples of suitable ion scavengers include compounds such as triazinethiol compounds and bisphenol-based reducing agents, which are known as copper inhibitors for preventing the ionization and leakage of copper, as well as inorganic ion adsorbents such as zirconium-based compounds and antimony-bismuth-based magnesium-aluminum compounds. From the viewpoints of the effects achieved, the heat resistance and the cost, the quantity used of these ion scavengers is preferably within a range from 0.01 to 10 parts by weight per 100 parts by weight of the polyurethaneimide-series resin.

If required, softening agents, age inhibitors, colorants, flame retardants, adhesion-imparting agents such as terpene-based resins, and thermoplastic polymer components may also be added to the adhesive layer 10. Thermoplastic polymer components can improve adhesion and impart favorable stress relaxation properties during curing, and suitable examples include polyvinyl butyral resins, polyvinyl formal resins, polyester resins, polyamide resins, polyimide resins, xylene resins, phenoxy resins, polyurethane resins, and acrylic rubbers. These thermoplastic polymer components preferably have a molecular weight within a range from 5,000 to 500,000.

The adhesive layer 10 preferably exhibits a main dispersion peak temperature in a dynamic viscoelasticity measurement that falls within a range from −100 to 50° C., and even more preferably from −80 to 30° C. In this description, the main dispersion peak temperature refers to the temperature that yields a maximum value for tan δ when a dynamic viscoelasticity measurement is conducted on the adhesive layer under conditions including a sample size of 35 mm×10 mm, a rate of temperature increase of 5° C./minute, a frequency of 1 Hz, a measurement temperature range from −150 to 300° C., and using a tensile mode. In those cases where tan δ exhibits a plurality of local maxima, the temperature that represents the largest of these maxima is used as the main dispersion peak temperature. The dynamic viscoelasticity measurement can be conducted, for example, using a viscoelasticity analyzer RSA-2 (a product name), manufactured by Rheometrics Inc.

If the main dispersion peak temperature is less than −100° C., then the handling properties of the film-like adhesive may deteriorate, whereas if the peak temperature exceeds 50° C., the temperature at which the adhesive can be bonded to semiconductor elements may exceed 100° C. By using a polyurethaneimide-series resin with a glass transition temperature within a range from −100 to 50° C., the main dispersion peak temperature of the adhesive layer 10 can usually be set within a range from −100 to 50° C. In those cases where a thermosetting resin and/or filler is added to the adhesive layer 10, the quantities added of those components are preferably adjusted to ensure that the main dispersion peak temperature for the adhesive layer 10 falls within the range from −100 to 50° C.

The adhesive layer 10 preferably exhibits a storage elastic modulus at 20° C. in a dynamic viscoelasticity measurement that is no more than 1,000 MPa, and even more preferably 500 MPa or less. In this description, the storage elastic modulus at 20° C. refers to the storage elastic modulus at 20° C. when a dynamic viscoelasticity measurement is conducted under the same conditions as those used in determining the main dispersion peak temperature. If this storage elastic modulus exceeds 1,000 MPa, then there tends to be an increased chance that the temperature required for lamination will exceed 100° C. Furthermore, the storage elastic modulus is preferably at least 0.01 MPa.

Using a polyurethaneimide-series resin with a glass transition temperature within a range from −100 to 50° C. and a weight average molecular weight within a range from 10,000 to 300,000 usually enables the storage elastic modulus at 20° C. for the adhesive layer 10 to be adjusted to a value of no more than 1,000 MPa. In those cases where a thermosetting resin and/or filler is added to the adhesive layer 10, the quantities added of those components are preferably adjusted to ensure that the storage elastic modulus at 20° C. for the adhesive layer 10 is no more than 1,000 MPa.

When subjected to pressurization at 9.8 MPa for 90 seconds while being heated at 180° C., the adhesive layer 10 preferably exhibits a flow amount that falls within a range from 50 to 2,000 µm, and even more preferably from 100 to 1,000 µm. This ensures that the adhesive layer exhibits favorable filling of indentations within the support member surface, as well as favorable suppression of voids within the die bonding layer. In this description, the flow amount described above is measured using a test specimen cut to a size of 10 mm×10 mm from an adhesive layer that has been prepared with a thickness of 40 µm±5 µm. Using either a structure in which a Upilex film with dimensions of 10 mm×10 mm and a thickness of 50 µm is superimposed on top of the test specimen, or a structure in which the adhesive layer is attached to a PET substrate and cut to the same dimensions, the structure is sandwiched between two slide glasses (with dimensions of 76 mm×26 mm and a thickness of 1.0 to 1.2 mm, manufactured by Matsunami Glass Ind., Ltd.). Subsequently, the slide glasses with the test specimen sandwiched therebetween is heated under pressure for 90 seconds by applying a load of 100 kgf/cm² (9.8 MPa) while heating on a hotplate at 180° C. The flow amount is deemed the maximum amount by which the adhesive layer protrudes beyond the Upilex film or PET substrate following this heating under pressure. This amount of protrusion of the adhesive layer refers to the distance from the outermost edge of the protruding adhesive layer to the edge of the Upilex film or PET substrate. This amount of protrusion of the adhesive layer can be measured using an optical microscope.

If this flow amount is less than 50 µm, then the filling of unevenness within the support member surface by application of heat and pressure during transfer molding tends to become problematic. In contrast, if the flow amount exceeds 2,000 µm, then the adhesive layer becomes overly fluid under the heating applied during die bonding or wire bonding, increasing the tendency for the adhesive to incorporate any residual gas bubbles retained within the uneven surface of the support member. If these gas bubbles become incorporated within the adhesive, then they are not removed entirely even under the heat and pressure applied during transfer molding, but are rather retained as voids within the die bonding layer, and during reflow, these voids tend to act as sources for promoting foaming.

By using a polyurethaneimide-series resin with a weight average molecular weight within a range from 10,000 to 300,000, the above flow amount can be controlled within a range from 100 to 2,000 µm even if the glass transition temperature of the polyurethaneimide-series resin is within a range from −100 to 50° C. Generally, in the case of film-like adhesives that use polyimide resins that contain no highly polar functional groups such as urethane groups within the principal chain, if the glass transition temperature of the polyimide resin is within a range from −100 to 50° C., then the above flow amount increases significantly, and restricting the amount to no more than 2,000 µm becomes extremely difficult. In contrast, in the case of film-like adhesives that use a polyurethaneimide-series resin, even if the glass transition temperature is within a range from −100 to 50° C., the interactions between molecular chains generated by the urethane groups cause the fluidity of the resin at temperatures equal to, or higher than, the glass transition temperature to be suppressed to some extent. It is thought that this enables the flow amount for the adhesive layer 10 to be easily kept within the aforementioned range.

Furthermore, when heated for one hour at 180° C., and subsequently subjected to pressurization at 9.8 MPa for 90 seconds while being heated at 180° C., the adhesive layer 10 preferably still exhibits a flow amount that falls within a range from 50 to 2,000 µm, and even more preferably from 100 to 1,000 µm. This ensures that the adhesive layer exhibits favorable filling of indentations within the support member surface, as well as favorable suppression of voids within the die bonding layer. This flow amount is measured by placing an adhesive layer with dimensions of 10 mm×10 mm and a thickness of 40 µm±5 µm on top of a slide glass (with dimensions of 76 mm×26 mm and a thickness of 1.0 to 1.2 mm, manufactured by Matsunami Glass hid., Ltd.), heating the resulting structure for one hour on top of a hotplate that has been heated to a surface temperature of 180° C., and then measuring the flow amount in the same manner as described above. If this flow amount falls outside the range specified above, then the ability of the adhesive layer to fill unevenness within the support member surface tends to deteriorate, and foaming tends to become more problematic during reflow.

In those cases where a thermosetting resin and/or filler is added to the adhesive layer 10, the quantities added of those components are preferably adjusted to ensure that the flow amount described above falls within the range from 50 to 2,000 µm. Particularly in those cases where a thermosetting resin is added, because there is a strong tendency for the fluidity of the adhesive layer upon heating to deteriorate, not only the quantity added, but also the structure and number of functional groups within the thermosetting resin are preferably optimized. For example, by reducing either the quantity added of the thermosetting resin or the number of functional groups within the thermosetting resin, any deterioration in the above flow amount can be suppressed. Furthermore, in those cases where an epoxy resin is used as the thermosetting resin, cross-linking reactions may occur between urethane groups or reaction terminal groups such as isocyanates or acid anhydrides within the polyurethaneimide-series resin, and the epoxy groups within the epoxy resin, and this type of cross-linking reaction can also cause a reduction in the flow amount. In such cases, the flow amount is preferably regulated by controlling the average molecular weight of the polyurethaneimide-series resin. If the average molecular weight of the polyurethaneimide-series resin is increased, then the number of the aforementioned reactive terminal groups decreases, thereby suppressing the reaction with the epoxy groups and suppressing any reduction in the flow amount. For this reason, the weight average molecular weight of the polyurethaneimide-series resin is preferably within a range from 50,000 to 200,000.

The type of film-like adhesive described above can be prepared using a varnish that contains the polyurethaneimide-series resin, and where required a thermosetting resin, a filler, and any other necessary components. In this method, a varnish is first prepared by mixing the components together in an organic solvent. This mixing for preparing the varnish can be conducted using a suitable combination of conventional stirrers, and dispersion devices such as a stone mill, three-roll mill, or ball mill. The thus prepared varnish is applied to the surface of a substrate film, and then heated and dried to form an adhesive layer, thus yielding the targeted film-like adhesive. The heating and drying can be conducted under conditions that ensure thorough volatilization of the organic solvent within the vanish, and is typically conducted by heating at 50 to 200° C. for a period of 0.1 to 90 minutes.

There are no particular restrictions on the organic solvent within the varnish, provided it is capable of dissolving or dispersing the materials uniformly. Suitable examples of the organic solvent include dimethylformamide, dimethylacetamide, N-methyl-2-pyrrolidone, dimethylsulfoxide, diethylene glycol dimethyl ether, toluene, benzene, xylene, methyl ethyl ketone, methyl isobutyl ketone, tetrahydrofuran, ethyl cellosolve, ethyl cellosolve acetate, butyl cellosolve, dioxane, cyclohexanone, and ethyl acetate. However, in those cases where a thermosetting resin such as an epoxy resin is included within the adhesive layer, amide-based solvents such as dimethylformamide, dimethylacetamide and N-methyl-2-pyrrolidone tend to promote cross-linking of the thermosetting resin. Accordingly, these factors are preferably taken into consideration when selecting the organic solvent to ensure the optimum flow amount for the adhesive layer.

The substrate film on which the adhesive layer is formed can use the same type of film as the substrate film 20 shown in FIG. 2. The adhesive film obtained by removing the substrate film following formation of the adhesive layer may be used as the film-like adhesive. Alternatively, the substrate film may be left attached to the adhesive layer, and the film-like adhesive used with an attached substrate film.

Figure 3:
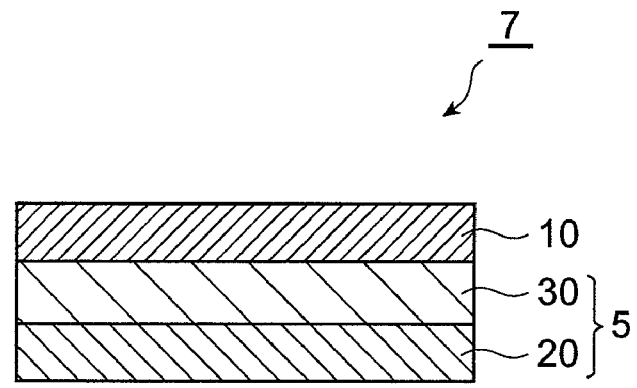
FIG. 3 is a cross-sectional view showing an embodiment of an adhesive sheet according to the present invention.

FIG. 3 is a cross-sectional view showing an embodiment of an adhesive sheet according to the present invention. The adhesive sheet 7 shown in FIG. 3 has a structure that includes a dicing sheet 5 comprising a pressure-sensitive adhesive layer 30 provided on one surface of a substrate film 20, and a film-like adhesive formed from an adhesive layer 10 laminated to the top of the pressure-sensitive adhesive layer 30. The adhesive layer 10 and the substrate film 20 are the same as those described above for the film-like adhesives 1a and 1b. Furthermore, the adhesive layer 10 of the adhesive sheet 7 is preferably preformed (precut) to a shape that is similar to that of the semiconductor wafer to which it is to be laminated.

In this manner, the adhesive sheet 7 comprises the pressure-sensitive adhesive layer 30, which functions as a dicing film, and a film-like adhesive of the present invention, which is laminated to the top of the pressure-sensitive adhesive layer 30 and functions as a die bonding adhesive. By adopting this configuration, the adhesive sheet 7 can function as a dicing film during the dicing step, and as a die bonding film during the die bonding step. By using the adhesive sheet 7, the process for producing a semiconductor device can be simplified significantly. For example, dicing can be conducted with the adhesive sheet 7 laminated to the backside of the semiconductor wafer, with the film-like adhesive side closest to the semiconductor wafer surface, and the thus formed semiconductor element with the film-like adhesive attached thereto can be picked up from the dicing sheet 5 and used as is within the die bonding step.

The pressure-sensitive adhesive layer 30 is formed using either a pressure-sensitive or radiation curable adhesive. The pressure-sensitive adhesive layer 30 is preferably formed using a radiation curable pressure-sensitive adhesive. In the case of a radiation curable pressure-sensitive adhesive, the level of adhesive force can be controlled so that the layer exhibits a powerful adhesive force during dicing, but by then irradiating the pressure-sensitive adhesive prior to pickup, exhibits only a weak adhesive force during pickup. In this description, the term "radiation curable pressure-sensitive adhesive" refers to a pressure-sensitive adhesive which when irradiated with radiation such as ultraviolet light undergoes a cross-linking reaction, meaning the level of adhesion after irradiation is different from that before irradiation.

In those cases where the pressure-sensitive adhesive layer 30 is formed using a radiation curable pressure-sensitive adhesive, the pressure-sensitive adhesive layer 30 preferably exhibits sufficient adhesive force to prevent the semiconductor elements from flying off during dicing. Furthermore, the pressure-sensitive adhesive layer 30 preferably also exhibits sufficiently low adhesive force following irradiation that no damage occurs to the semiconductor elements during pickup. More specifically, when the adhesive sheet 7 is laminated to the backside of the semiconductor wafer with the adhesive layer 10 contacting the wafer, if the 90° peel strength at 25° C. for the film-like adhesive relative to the semiconductor wafer is deemed A, and the 90° peel strength at 25° C. for the pressure-sensitive adhesive layer relative to the film-like adhesive following UV irradiation using an exposure dose of 500 mJ/cm$^2$ is deemed B, then the value of A−B is preferably at least 1 N/m. This value of A−B is even more preferably 5 N/m or greater, and is most preferably 10 N/m or greater. If the value of A−B is less than 1 N/m, then there is an increased chance of the semiconductor elements sustaining damage during pickup, or of peeling occurring preferentially at the interface between the semiconductor wafer and the film-like adhesive upon pickup, meaning a normal pickup cannot be achieved.

Figure 4:
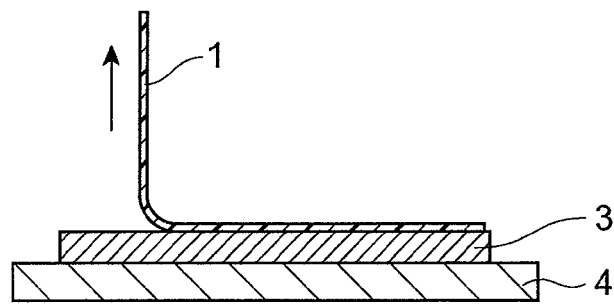
FIG. 4 is a cross-sectional view showing a method of measuring 90° peel strength.

FIG. 4 is a cross-sectional view showing a method of measuring the 90° peel strength at 25° C. for the film-like adhesive relative to the semiconductor wafer. The 90° peel strength at 25° C. for the film-like adhesive 1 relative to the semiconductor wafer 3 is determined using the method described below. Namely, a 1 cm wide film-like adhesive 1 is first laminated to the backside (the backgrind treated surface) of a semiconductor wafer 3 laminated on top of a support 4 by heating to 80° C. while the adhesive layer is held against the semiconductor wafer 3. Subsequently, the peel strength is measured as the film-like adhesive 1 is peeled up at an angle of 90° (in the direction of the arrow in the drawing), as shown in FIG. 4. During this measurement, the peel speed is preferably set to 100 mm/minute.

Figure 5:
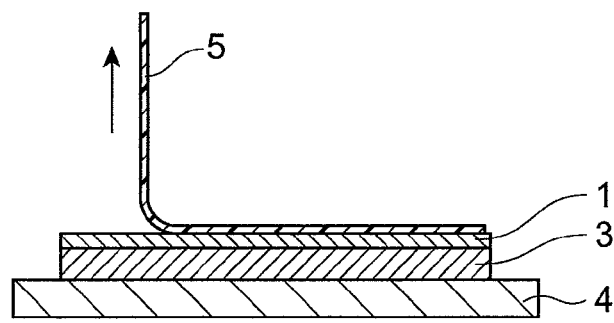
FIG. 5 is a cross-sectional view showing a method of measuring 90° peel strength.

FIG. 5 is a cross-sectional view showing a method of measuring the 90° peel strength at 25° C. for a pressure-sensitive adhesive layer relative to the film-like adhesive. The 90° peel strength at 25° C. for a pressure-sensitive adhesive layer relative to the film-like adhesive 1 is determined using the method described below. Namely, a 1 cm wide adhesive sheet is first laminated to the backside (the backgrind treated surface) of a semiconductor wafer 3 laminated on top of a support 4 by heating to 80° C. while the film-like adhesive 1 of the adhesive sheet is held against the semiconductor wafer 3, and the adhesive sheet is then subjected to UV irradiation using an exposure dose of 500 mJ/cm$^2$. Subsequently, the peel strength is measured as the dicing sheet 5 is peeled up at an angle of 90° (in the direction of the arrow in the drawing), as shown in FIG. 5. During this measurement, the peel speed is preferably set to 100 min/minute.

In those cases where the pressure-sensitive adhesive layer 30 is formed using a radiation curable pressure-sensitive adhesive, the pressure-sensitive adhesive preferably contains a polymer that functions as an elastomer, and a radiation polymerizable oligomer.

The polymer is preferably an acrylic-based polymer. Examples of suitable acrylic-based polymers include (meth) acrylate ester copolymers containing mainly (meth)acrylate esters or derivatives thereof as monomer units, as well as mixtures of such copolymers. In the present invention, the terms "(meth)acrylic" and "(meth)acrylate" are generic terms including acrylic and methacrylic, and acrylate and methacrylate respectively.

Examples of the (meth)acrylate ester copolymers described above include copolymers of at least one alkyl (meth)acrylate monomer containing an alkyl group of 1 to 15 carbon atoms (the monomer a), at least one monomer selected from the group consisting of glycidyl(meth)acrylate, dim ethylaminoethyl(meth)acrylate, diethylaminoethyl(meth) acrylate, 2-hydroxyethyl(meth)acrylate, vinyl acetate, styrene, and vinyl chloride (the monomer b), and at least one monomer selected from the group consisting of acrylic acid, methacrylic acid and maleic acid (the monomer c).

The copolymerization ratio for the aforementioned monomer a, monomer b and monomer c, reported as a weight ratio relative to a combined total of 100, preferably satisfies the formula: monomer a/monomer b/monomer c=35 to 99/1 to 60/0 to 5. In those cases where the monomer c is not included as a monomer unit, the ratio preferably satisfies the formula: monomer a/monomer b=70 to 95/5 to 30.

If the proportion of the monomer b exceeds 60% by weight, then the pressure-sensitive adhesive layer 30 becomes a completely co-soluble system, meaning the elastic modulus of the pressure-sensitive adhesive layer 30 following irradiation may exceed 10 MPa. As a result, satisfactory levels of expandability and pickup characteristics tend to be more difficult to achieve. In contrast, if the proportion of the monomer b is less than 1% by weight, then the pressure-sensitive adhesive layer 30 becomes a non-uniform dispersion, meaning obtaining a favorable level of adhesion tends to be more difficult.

In those cases where (meth)acrylic acid is used as the monomer c, the proportion of (meth)acrylic acid is preferably no more than 5% by weight of the total copolymer. If the proportion of (meth)acrylic acid exceeds 5% by weight, then the pressure-sensitive adhesive layer 30 becomes a completely co-soluble system, meaning satisfactory levels of expandability and pickup characteristics tend to be more difficult to achieve.

The weight average molecular weight of the aforementioned (meth)acrylate ester copolymer is preferably within a range from $2.0 \times 10^5$ to $10.0 \times 10^5$, and even more preferably from $4.0 \times 10^5$ to $8.0 \times 10^5$.

The radiation polymerizable oligomer that is combined with the aforementioned polymer that functions as an elastomer is an oligomer that undergoes polymerization upon irradiation with ultraviolet light or the like. Specific examples of ideal radiation polymerizable oligomers include oligomers containing at least one carbon-carbon double bond, such as urethane acrylate-based oligomers, epoxy-modified urethane acrylate oligomers, and epoxy acrylate oligomers. Of these, urethane acrylate-based oligomers are particularly preferred as any of a variety of oligomers can be selected in accordance with the intended purpose.

Urethane acrylate-based oligomers can be obtained, for example, by reacting an isocyanate-terminated urethane prepolymer, which can be obtained by reacting a polyol compound with a polyvalent isocyanate compound, with an acrylate or methacrylate containing a hydroxyl group. Examples of the polyol compound include polyester-based or polyether-based polyol compounds. Examples of the polyvalent isocyanate compound include 2,4-tolylene diisocyanate, 2,6-tolylene diisocyanate, 1,3-xylylene diisocyanate, 1,4-xylylene diisocyanate, and diphenylmethane-4,4-diisocyanate. Examples of the acrylate or methacrylate containing a hydroxyl group include 2-hydroxyethyl acrylate, 2-hydroxyethyl methacrylate, 2-hydroxypropyl acrylate, 2-hydroxypropyl methacrylate, polyethylene glycol acrylate, and polyethylene glycol methacrylate.

The molecular weight of the radiation polymerizable oligomer is typically within a range from 3,000 to 30,000, and is preferably from 3,000 to 10,000, even more preferably from 5,000 to 10,000, and most preferably from 4,000 to 8,000.

The radiation polymerizable oligomer is preferably dispersed uniformly throughout the pressure-sensitive adhesive layer 30. The dispersion particle size is preferably within a range from 1 to 30 μm, and even more preferably from 1 to 10 μm. In this description, the term "dispersion particle size" refers to the value determined by viewing a cross-section of the pressure-sensitive adhesive layer 30 under an optical microscope at a magnification of 600 times, and then measuring the size of the dispersed oligomer particles that appear within the microscope viewing area. Furthermore, a state of uniform dispersion refers to a state in which the distance between adjacent particles is within a range from 0.1 to 10 μm.

In the pressure-sensitive adhesive layer 30, the quantity of the radiation polymerizable oligomer relative to 100 parts by weight of the polymer that functions as an elastomer is preferably within a range from 20 to 200 parts by weight, and even more preferably from 50 to 150 parts by weight. If this quantity of the radiation polymerizable oligomer is either less than 20 parts by weight or greater than 200 parts by weight, then either the adhesive strength between the pressure-sensitive adhesive layer 30 and the film-like adhesive prior to irradiation tends to weaken, or the adhesive strength following irradiation tends not to reduce sufficiently. Furthermore, by ensuring that the proportion of the radiation polymerizable oligomer falls within the above range, a suitable elastic modulus can be maintained after irradiation. As a result, a favorable chip separation can be readily achieved during the expansion step, problems such as chip misalignment can be prevented, and pickup can be conducted with favorable stability. If necessary, the pressure-sensitive adhesive layer 30 may also incorporate other components.

The types of film-like adhesives of the present invention described above can be used as the adhesive for die bonding semiconductor elements such as ICs and LSIs to semiconductor-mounting support members. Examples of semiconductor-mounting support members that are ideally suited to die bonding using a film-like adhesive of the present invention include lead frames such as 42-alloy lead frames and copper lead frames, plastic films formed from polyimide resins or epoxy resins or the like, plastic films such as polyimide resins or epoxy resins that have been reinforced with a glass unwoven base material, and ceramics such as alumina. A film-like adhesive of the present invention is particularly suitable for conducting die bonding to organic substrates with an organic resist layer provided on the surface, and in particular to wired organic substrates with uneven surfaces containing level differences caused by wiring. In this description, a "wired organic substrate" refers to an organic substrate comprising mainly organic materials such as glass fiber reinforced resins, thermoplastic resins or thermosetting resins, wherein wiring such as a conductive pattern formed from a conductive material is provided on the surface of the substrate.

Furthermore, a film-like adhesive of the present invention can be used as the adhesive for bonding together adjacent semiconductor elements in 3D package semiconductor devices (Stacked-PKG) in which a plurality of semiconductor elements are stacked on top of a support member.

As follows is a detailed description, based on the drawings, of semiconductor devices that include a film-like adhesive of the present invention, as examples of potential applications of the film-like adhesive of the present invention. However the applications of the film-like adhesive of the present invention are in no way limited to the semiconductor devices according to the embodiments described below.

Figure 6:
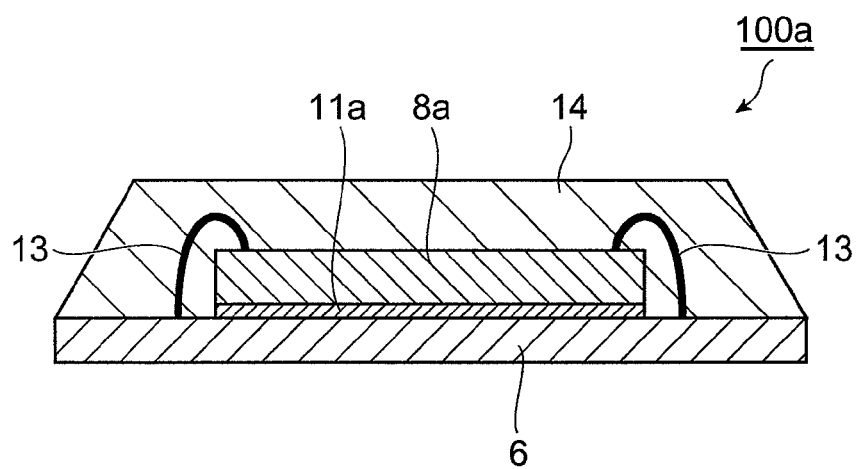
FIG. 6 is a cross-sectional view showing an embodiment of a semiconductor device according to the present invention.

FIG. 6 is a cross-sectional view showing an embodiment of a semiconductor device according to the present invention. In a semiconductor device 100a shown in FIG. 6, a semiconductor element 8a is bonded to a support member 6 via a die bonding layer 11a formed from a film-like adhesive of the present invention. The connection terminals (not shown in the drawing) of the semiconductor element 8a are connected electrically to external connection terminals (not shown in the drawing) by wires 13. The semiconductor element 8a and the wires 13 and the like are sealed by a sealing material layer 14.

Figure 7:
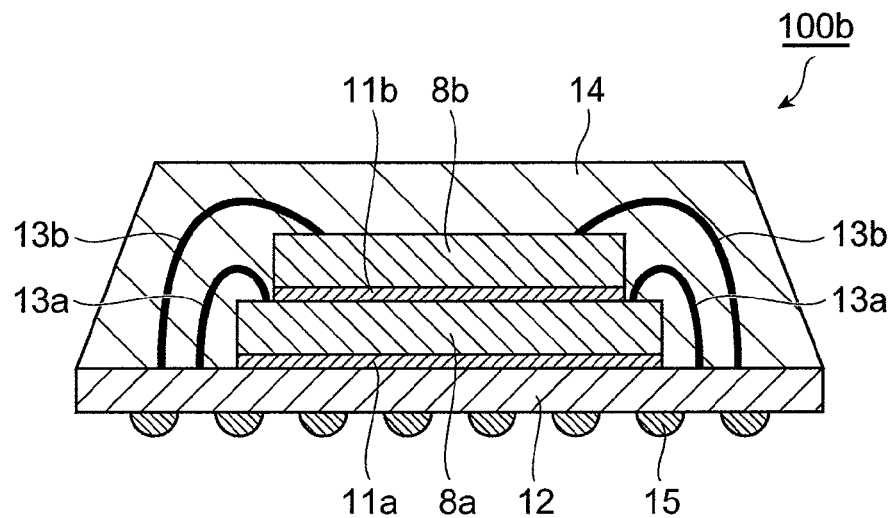
FIG. 7 is a cross-sectional view showing another embodiment of a semiconductor device according to the present invention.

FIG. 7 is a cross-sectional view showing another embodiment of a semiconductor device according to the present invention. In a semiconductor device 100b shown in FIG. 7, a first stage semiconductor element 8a is bonded to a support member 12 via a die bonding layer 11a formed from a film-like adhesive of the present invention. Another semiconductor element 8b is bonded to the top of the semiconductor element 8a via another die bonding layer 11b formed from a film-like adhesive of the present invention. Moreover, the entire structure is sealed by a sealing material layer 14. The connection terminals (not shown in the drawing) of the semiconductor element 8a and the semiconductor element 8b are connected electrically to external connection terminals by wires 13a and 13b respectively.

Because the die bonding layers in these semiconductor devices of the present invention are formed using a film-like adhesive for die bonding according to the present invention, the devices exhibit favorable reflow resistance, humidity resistance reliability, and reliability of the insulation between wiring sections.

The semiconductor devices (semiconductor packages) shown in FIG. 6 and FIG. 7 can be produced by a production method comprising a die bonding step that uses a film-like adhesive of the present invention, as well as subsequent steps such as a wire bonding step and a sealing step using a sealing material. In the die bonding step, a semiconductor element with the film-like adhesive laminated thereto is first mounted on top of a support member so that the film-like adhesive is sandwiched between the element and the support member. Subsequently, by subjecting the entire structure to heating and pressurization in this state, the semiconductor element is bonded to the support member. The heating conditions employed in the die bonding step typically involve heating at 20 to 250° C. for a period of 0.1 to 300 seconds.

Figure 8:
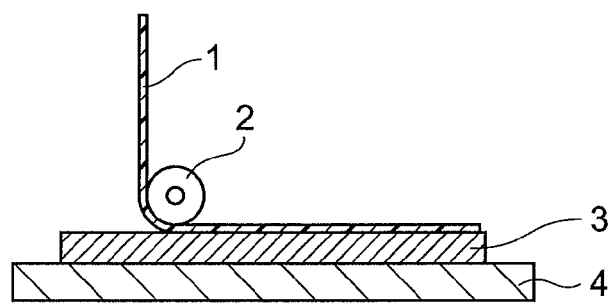
FIG. 8 is a cross-sectional view showing a method of laminating a film-like adhesive to a semiconductor wafer.
Figure 9:
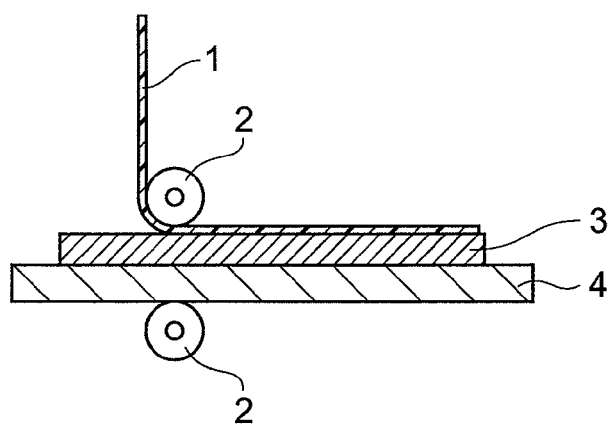
FIG. 9 is a cross-sectional view showing another method of laminating a film-like adhesive to a semiconductor wafer.

FIG. 8 and FIG. 9 are cross-sectional views showing methods of laminating a film-like adhesive to a semiconductor wafer. As shown in FIG. 8, a film-like adhesive 1 can be laminated to the backside of a semiconductor wafer 3 mounted on a support 4 (that is, the opposite side of the wafer 3 from the support 4) by applying pressure with a roller 2. Alternatively, as shown in FIG. 9, the film-like adhesive 1 can be laminated by sandwiching the support 4, the semiconductor wafer 3 and the film-like adhesive 1 between a pair of opposing rollers 2. The rollers 2 are preferably heated to a temperature of approximately 80° C. Furthermore, the rollers 2 are preferably moved at a drive speed of approximately 0.5 m/minute, while applying a pressure equivalent to a linear pressure of approximately 4 kgf/cm to the film-like adhesive.

The present invention is able to provide a film-like adhesive for use in wafer backside laminating methods, which can be applied to ultra thin wafers, and to 3D packages in which a plurality of semiconductor elements are stacked together. When a conventional film-like adhesive is bonded to the backside of a wafer, usually heating is conducted to a temperature capable of melting the film-like adhesive, but if a film-like adhesive of the present invention is used, then lamination to the wafer backside can be achieved at a temperature lower than the softening temperature of the backgrind tape of an ultra thin wafer or the dicing tape used for laminating. As a result, the thermal stress imparted to the wafer is reduced, and problems such as the warping of large wafers of reduced thickness can be resolved. Furthermore, the present invention also enables precise control of the fluidity of the adhesive layer. Furthermore, because a film-like adhesive of the present invention is able to maintain superior adhesive strength at high temperatures, the reliability of the heat resistance and humidity resistance properties can be improved.

In addition, because a film-like adhesive of the present invention enables favorable properties to be retained even under the heat history accumulated during package assembly, the adhesive can cope with lengthier heat history imparted during the semiconductor production process. The heat and pressure applied during transfer molding of the sealing material is sufficient to enable favorable filling of indentations within the support member surface, and the occurrence of voids within the die bonding layer is also adequately suppressed.

By optimizing the adhesive layer (adding other components and optimizing the composition of the film, etc.), thermal stress problems such as wafer warping can be reduced even further, chip flying during dicing can be suppressed, and other properties such as the pickup properties (releasability from a dicing tape), the workability during semiconductor device production, and level of out gas can also be improved.

Furthermore, the present invention also provides an adhesive sheet comprising a film-like adhesive described above laminated to a dicing sheet. According to an adhesive sheet of the present invention, even the dicing process can be simplified, that is, the step of laminating a dicing tape can be removed.

In addition, the present invention is also able to provide a semiconductor device that uses the aforementioned film-like adhesive. The semiconductor device of the present invention is a semiconductor device of superior reliability that can be produced via a simplified production process. The semiconductor device of the present invention exhibits the heat resistance and humidity resistance required for those cases where semiconductor elements with large differences in the thermal expansion coefficient are mounted to a support member for mounting semiconductor elements, and also exhibits favorable reflow resistance, humidity resistance reliability, and reliability of the insulation between wiring sections.

EXAMPLES

As follows is a description of specifics of the present invention, based on a series of examples and comparative examples. However, the present invention is in no way limited to these examples.

Synthesis Examples

Synthesis of Polyurethaneimide Resin (PUI-1)

A 300 ml flask fitted with a thermometer, a stirrer, a condenser, and a nitrogen inlet tube was charged with 9.34 g of diphenylmethane-4,4'-diisocyanate (manufactured by Wako Pure Chemical Industries, Ltd.), 29.87 g of a polytetramethylene glycol with an average molecular weight of 2,000 (manufactured by Wako Pure Chemical Industries, Ltd.), and 105 g of N-methyl-2-pyrrolidone (anhydrous grade), and using this mixture as the reaction liquid, reaction was conducted for one hour under an atmosphere of nitrogen while heating at 100° C., thus producing a urethane oligomer having isocyanate groups at the terminals.

Subsequently, 5.79 g of 4,4'-oxydiphthalic anhydride (the compound represented by the above formula (30a)) that had undergone preliminary heat treatment for 12 hours in an oven at 170° C. was added to the reaction liquid, and reaction was continued for a further 3 hours while heating at 160° C., thus yielding a solution of a polyurethaneimide resin (PUI-1). Measurement of the thus obtained polyurethaneimide resin using GPC revealed polystyrene equivalent values of Mn=64,300 and Mw=142,500.

Synthesis of Polyurethaneimide Resin (PUI-2)

A 300 ml flask fitted with a thermometer, a stirrer, a condenser, and a nitrogen inlet tube was charged with 4.67 g of diphenylmethane-4,4'-diisocyanate (manufactured by Wako Pure Chemical Industries, Ltd.), 4.67 g of diphenylmethane-2,4'-diisocyanate (manufactured by BASF Corporation), 29.87 g of a polytetramethylene glycol with an average molecular weight of 2,000 (manufactured by Wako Pure Chemical Industries, Ltd.), and 105 g of N-methyl-2-pyrrolidone (anhydrous grade), and using this mixture as the reaction liquid, reaction was conducted for one hour under an atmosphere of nitrogen while heating at 100° C., thus producing a urethane oligomer having isocyanate groups at the terminals.

Subsequently, 5.79 g of 4,4'-oxydiphthalic anhydride that had undergone preliminary heat treatment for 12 hours in an oven at 170° C. was added to the reaction liquid, and reaction was continued for a further 3 hours while heating at 160° C., thus yielding a solution of a polyurethaneimide resin (PUI-2). Measurement of the thus obtained polyurethaneimide resin using GPC revealed polystyrene equivalent values of Mn=53,800 and Mw=118,200.

Synthesis of Polyurethaneimide Resin (PUI-3)

A 300 ml flask fitted with a thermometer, a stirrer, a condenser, and a nitrogen inlet tube was charged with 9.34 g of diphenylmethane-4,4'-diisocyanate (manufactured by Wako Pure Chemical Industries, Ltd.), 29.87 g of a polytetramethylene glycol with an average molecular weight of 2,000 (manufactured by Wako Pure Chemical Industries, Ltd.), and 105 g of N-methyl-2-pyrrolidone (anhydrous grade), and using this mixture as the reaction liquid, reaction was conducted for one hour under an atmosphere of nitrogen while heating at 100° C., thus producing a urethane oligomer having isocyanate groups at the terminals.

Subsequently, 5.79 g of 4,4'-oxydiphthalic that had undergone preliminary heat treatment for 12 hours in an oven at 170° C. was added to the reaction liquid, and reaction was continued for a further 3 hours while heating at 160° C., thus yielding a solution of a polyurethaneimide resin. This solution was then poured into 5 L of distilled water with constant stirring, and the precipitate was collected by filtration. The precipitate was then washed in 3 L of methanol, air dried overnight, and then dried for a further 12 hours at 60° C. in a vacuum dryer, yielding a powdered polyurethaneimide resin. This powdered polyurethaneimide resin was redissolved in cyclohexanone, yielding a solution of a polyurethaneimide resin (PUI-3). Measurement of the thus obtained polyurethaneimide resin using GPC revealed polystyrene equivalent values of Mn=67,900 and Mw=151,400.

Synthesis of Polyimide Resin (PI-A)

A 300 ml flask fitted with a thermometer, a stirrer, a condenser, and a nitrogen inlet tube was charged with 2.73 g (0.02 mols) of 2,2-bis(4-aminophenoxyphenyl)propane, 24.00 g (0.08 mols) of polysiloxanediamine (KF-8010 (a product name), manufactured by Shin-Etsu Silicones, molecular weight: 900), and 176.5 g of N-methyl-2-pyrrolidone (anhydrous grade), and the resulting reaction liquid was stirred.

Following dissolution of the polysiloxanediamine, the flask was cooled in an ice bath, and 17.40 g (0.1 mols) of decamethylene-bistrimellitate dianhydride that had been purified in advance by recrystallization from acetic anhydride (and exhibited a difference between the endothermic start temperature and the endothermic peak temperature as determined by DSC of 5° C.) was added gradually to the reaction liquid. Reaction was then continued at room temperature for 8 hours, 117.7 g of xylene was added, and the reaction mixture was heated to 180° C. while nitrogen gas was blown through the system, thereby removing water and xylene by azeotropic distillation, and yielding a solution of a polyimide resin (PI-A). Measurement of the polyimide resin by GPC revealed polystyrene equivalent values of Mn=12,300 and Mw=28,700.

Synthesis of Polyimide Resin (PI-B)

A 300 ml flask fitted with a thermometer, a stirrer, a condenser, and a nitrogen inlet tube was charged with 2.71 g (0.045 mols) of 1,12-diaminododecane, 5.77 g (0.01 mols) of a polyetherdiamine (ED2000 (a product name), manufactured by BASF Corporation, molecular weight: 1,923), 3.35 g (0.045 mols) of 1,3-bis(3-aminopropyl)tetramethyldisiloxane (LP-7100 (a product name), manufactured by Shin-Etsu Chemical Co., Ltd.), and 113 g of N-methyl-2-pyrrolidone, and the resulting reaction liquid was stirred.

Following dissolution of the 1,12-diaminododecane and polyetherdiamine, the flask was cooled in an ice bath, and 15.62 g (0.1 mols) of 4,4'-(4,4'-isopropylidenediphenoxy)bis (phthalic anhydride) that had been purified in advance by recrystallization from acetic anhydride (and exhibited a difference between the endothermic start temperature and the endothermic peak temperature as determined by DSC of 2.5° C.) was added gradually to the reaction liquid. Reaction was then continued at room temperature for 8 hours, 75.5 g of xylene was added, and the reaction mixture was heated to 180° C. while nitrogen gas was blown through the system, thereby removing water and xylene by azeotropic distillation, and yielding a solution of a polyimide resin (PI-B). Measurement of the polyimide resin by GPC revealed polystyrene equivalent values of Mn=16,300 and Mw=42,600.

Synthesis of Polyimide Resin (PI-C)

A 300 ml flask fitted with a thermometer, a stirrer, a condenser, and a nitrogen inlet tube was charged with 2.71 g (0.045 mols) of 1,12-diaminododecane, 5.77 g (0.01 mols) of a polyetherdiamine (ED2000 (a product name), manufactured by BASF Corporation, molecular weight: 1,923), 3.35 g (0.045 mols) of 1,3-bis(3-aminopropyl)tetramethyldisiloxane (LP-7100 (a product name), manufactured by Shin-Etsu Chemical Co., Ltd.), 15.62 g (0.1 mols) of 4,4'-(4,4'-isopropylidenediphenoxy)bis(phthalic anhydride) that had been purified in advance by recrystallization from acetic anhydride (and exhibited a difference between the endothermic start temperature and the endothermic peak temperature as determined by DSC of 2.5° C.), and 113 g of N-methyl-2-pyrrolidone, and the resulting reaction liquid was then heated to 180° C. under constant stirring while nitrogen gas was blown through the system, thereby allowing the reaction to progress. The water generated within the reaction liquid was then removed, yielding a solution of a polyimide resin (PI-C). Measurement of the polyimide resin by GPC revealed polystyrene equivalent values of Mn=22,600 and Mw=121,400.

Synthesis of Polyimide Resin (PI-D)

A 300 ml flask fitted with a thermometer, a stirrer, a condenser, and a nitrogen inlet tube was charged with 13.67 g (0.1 mols) of 2,2-bis(4-aminophenoxyphenyl)propane and 124 g of N-methyl-2-pyrrolidone, and the resulting reaction liquid was stirred.

Following dissolution of the 2,2-bis(4-aminophenoxyphenyl)propane, the flask was cooled in an ice bath, and 17.40 g (0.1 mols) of decamethylene-bistrimellitate dianhydride that had been purified in advance by recrystallization from acetic anhydride (and exhibited a difference between the endothermic start temperature and the endothermic peak temperature as determined by DSC of 5° C.) was added gradually to the reaction liquid. Reaction was then continued at room temperature for 8 hours, 83 g of xylene was added, and the reaction mixture was heated to 180° C. while nitrogen gas was blown through the system, thereby removing water and xylene by azeotropic distillation, and yielding a solution of a polyimide resin (PI-D). Measurement of the polyimide resin by GPC revealed polystyrene equivalent values of Mn=22,800 and Mw=121,000.

Example 1

The solution of the polyurethaneimide resin (PUI-1) obtained above was mixed together uniformly with the materials shown in Table 1 (an epoxy resin, curing agent, curing accelerator, and filler), in the proportions (parts by weight) shown in Table 1, thereby yielding a varnish. This varnish was applied to the surface of a substrate film (release agent-treated PET) in sufficient quantity to generate a thickness of 40 and was then heated in an oven at 80° C. for 30 minutes, and then at 150° C. for a further 30 minutes to remove the NMP. Following subsequent cooling to room temperature, the substrate film was peeled off, yielding a film-like adhesive.

Examples 2, 3, and 4

Using varnishes prepared using the materials and composition proportions shown in Table 1, film-like adhesives of thickness 40 μm comprising a polyurethaneimide resin were prepared in the same manner as the example 1.

TABLE 1

| Component | Example 1 | Example 2 | Example 3 | Example 4 |
|---|---|---|---|---|
| Polyurethaneimide resin (parts by weight*) | PUI-1 (100) | PUI-1 (100) | PUI-2 (100) | PUI-3 (100) |
| Epoxy resin (parts by weight) | ESCN195 (11.7) | ESCN195 (5.0) | ESCN195 (11.7) | ESCN195 (5.0) |
| Curing agent (parts by weight) | TrisP-PA (8.2) | — | TrisP-PA (8.2) | TrisP-PA (8.2) |
| Curing accelerator (parts by weight) | TPPK (0.1) | — | TPPK (0.1) | TPPK (0.1) |
| Filler (% by volume) | HP-P1 (10) | HP-P1 (10) | HP-P1 (10) | HP-P1 (10) |
| Coating solvent | NMP | NMP | NMP | CHN |

*Quantity of the polyurethaneimide resin (excluding the solvent)

Comparative Examples 1, 2, 3, and 4

Using varnishes prepared using the materials and blend ratios shown in Table 2, film-like adhesives of thickness 40 μm comprising a polyimide resin were prepared in the same manner as the example 1.

TABLE 2

| Component | Comparative Example 1 | Comparative Example 2 | Comparative Example 3 | Comparative Example 4 |
|---|---|---|---|---|
| Polyimide resin (parts by weight*) | PI-A (100) | PI-B (100) | PI-C (100) | PI-D (100) |
| Epoxy resin (parts by weight) | ESCN195 (11.7) | ESCN195 (11.7) | ESCN195 (11.7) | ESCN195 (11.7) |
| Curing agent (parts by weight) | TrisP-PA (8.2) | TrisP-PA (8.2) | TrisP-PA (8.2) | TrisP-PA (8.2) |
| Curing accelerator (parts by weight) | TPPK (0.1) | TPPK (0.1) | TPPK (0.1) | TPPK (0.1) |
| Filler (% by volume) | HP-P1 (10) | HP-P1 (10) | HP-P1 (10) | HP-P1 (10) |
| Coating solvent | NMP | NMP | NMP | NMP |

*Quantity of the polyimide resin (excluding the solvent)

The specific content of the raw materials listed in Table 1 and Table 2 are as follows.

ESCN-195 (a product name): manufactured by Sumitomo Chemical Co., Ltd., a cresol novolac solid epoxy resin (epoxy equivalence: 200, molecular weight: 778)

TrisP-PA (a product name): manufactured by Honshu Chemical Industry Co., Ltd., a trisphenol novolac (OH equivalence: 141, molecular weight: 424)

TPPK: tetraphenylphosphonium tetraphenylborate, manufactured by Tokyo Chemical Industry Co., Ltd.

NMP: N-methyl-2-pyrrolidone, manufactured by Kanto Chemical Co., Inc.

CHN: cyclohexanone, manufactured by Kanto Chemical Co., Inc.

HP-P1 (a product name): manufactured by Mizushima Ferroalloy Co., Ltd., boron nitride (average particle size: 1.0 μm, maximum particle size: 5.1 μm)

(Evaluation of Film-Like Adhesives)

The film-like adhesives from the examples 1 through 4 and the comparative examples 1 through 4 were evaluated for the storage elastic modulus at 20° C., main dispersion peak temperature, chip flying during dicing, flow amount, peel strength, the state of the film-like adhesive following transfer molding, and reflow resistance using the methods described below. The results of these evaluations are summarized in Table 3.

<Storage Elastic Modulus at 20° C.>

A test specimen was prepared by cutting the film-like adhesive to a size of 35 mm×10 mm, and a viscoelasticity analyzer RSA-2 (a product name) manufactured by Rheometrics Inc. was then used to determine the storage elastic modulus at 20° C. by conducting measurements under conditions including a rate of temperature increase of 5° C./minute, a frequency of 1 Hz, and a measurement temperature range from −150 to 300° C.

<Main Dispersion Peak Temperature>

In the measurement described above for determining the storage elastic modulus, the temperature that yielded the maximum value for tan δ was used as the main dispersion peak temperature for the film-like adhesive. In those cases where tan δ exhibited a plurality of local maxima, the temperature that represented the largest of these maxima was used as the main dispersion peak temperature.

<Chip Flying During Dicing>

The film-like adhesive was laminated to the backside (the opposite side from the support) of a silicon wafer (5-inch diameter, thickness: 300 μm) mounted on a support by applying pressure using a pair of rollers (temperature: 80° C., linear pressure: 4 kgf/cm, drive speed: 0.5 m/minute) (the same method as that shown in FIG. 9). Subsequently, a dicing tape (AD-80H, a pressure-sensitive, peelable tape manufactured by Denki Kagaku Kogyo Kabushiki Kaisha) was laminated to the film-like adhesive, on the opposite surface from the silicon wafer. Using a dicer and conditions including a dicing speed of 10 mm/second and a rotational speed of 30,000 rpm, the sample was subjected to dicing into chips of size 5 mm×5 mm, and the operation was observed for occurrences of chip flying. If the proportion of locations at which chip flying occurred was no more than 10% of the entire silicon wafer, then an evaluation of "no chip flying" was recorded. Chip fragments at the edges of the silicon wafer that flew up after cutting were excluded from the evaluation.

<Flow Amount>

A film-like adhesive attached to a PET substrate (thickness: 50 μm) was cut to a size of 10 mm×10 mm to prepare a test specimen. This test specimen was sandwiched between two slide glasses (with dimensions of 76 mm×26 mm and a thickness of 1.0 to 1.2 mm, manufactured by Matsunami Glass Ind., Ltd.), and then heated under pressure for 90 seconds, by applying an overall load of 100 kgf/cm² while heating on a hotplate at 180° C. Following heating, the amount by which the adhesive layer had protruded beyond the PET substrate was measured using a calibrated optical microscope. The maximum value for this protrusion amount was deemed the initial flow amount.

Furthermore, a test specimen was also placed on top of a similar slide glass to those described above, with the PET substrate positioned on the opposite side to the slide glass, and this structure was then heated for one hour on top of a hotplate that had been heated to a surface temperature of 180° C. Subsequently, another slide glass similar to those described above was placed on top of the test specimen, and the resulting structure was heated under pressure for 90 seconds, by applying an overall load of 100 kgf/cm² while heating on a hotplate at 180° C. Following heating, the amount by which the adhesive layer had protruded beyond the PET substrate was measured using a calibrated optical microscope. The maximum value for this protrusion amount was deemed the post-heating flow amount.

<Peel Strength>

Using an adhesive strength evaluation apparatus shown in FIG. 10, the peel strength between the semiconductor element (the silicon chip) 8 and the film-like adhesive 1 was measured in the manner described below. The adhesive strength evaluation apparatus shown in FIG. 10 is an apparatus in which a grab handle 26 is provided at the tip of a rod fitted to a push-pull gauge 24, and the angle of the grab handle 26 is able to vary around a fulcrum 27.

First, a semiconductor element 8 of thickness 0.4 mm, dimensions of 5 mm×5 mm, and having protrusions at the edge was die bonded to a support substrate 12 comprising a solder resist layer of thickness 15 μm laminated on one surface of an organic substrate of thickness 0.1 mm. Specifically, the film-like adhesive 1 of dimensions 5 mm×5 mm was sandwiched between the surface of the solder resist layer of the support substrate 12 and the semiconductor element 8, and die bonding was conducted by applying a pressure of 500 gf per single semiconductor element for a period of 3 seconds, while heating at a temperature equivalent to the main dispersion peak temperature of the film-like adhesive 1 +100° C. Subsequently, a pressure of 9.8 MPa was applied while the film-like adhesive 1 was heated at 180° C. for 10 seconds. Following curing of the film-like adhesive 1 by heating at 180° C. for 5 hours, the structure was heated for 30 seconds on a hotplate 25 at 260° C. Subsequently, with the grab handle 26 hooked under the protrusion of the semiconductor element 8, the peel stress as the grab handle 26 was moved at a speed of 0.5 mm/second was measured by the push-pull gauge 24, thereby determining the peel strength.

<State of Film-Like Adhesive Following Transfer Molding>

A semiconductor element (silicon chip) of thickness 280 μm and dimensions of 6.5 mm×6.5 mm was die bonded to a support member comprising a solder resist layer of thickness 15 μm and copper wiring (wiring height: 12 μm) provided on one surface of an organic substrate of thickness 0.1 mm. Specifically, the film-like adhesive of dimensions 6.5 mm×6.5 mm was sandwiched between the surface of the solder resist layer of the support member and the semiconductor element, and die bonding was conducted by applying a pressure of 300 gf (this loading was adjusted so that the film-like adhesive did not bury the wiring on the support member, but was rather maintained in a tent-like state stretched over the top of the wiring) per single semiconductor element for a period of 3 seconds, while heating at a temperature equivalent to the main dispersion peak temperature of the film-like adhesive +100° C.

Subsequently, the entire structure was covered with a sealing material in a transfer molding process (mold temperature: 180° C., cure time: 2 minutes), and the sealing material was then cured by heating in an oven at 180° C. for 5 hours, thereby yielding a semiconductor device (CSP-96 pin, sealed area: 10 mm×10 mm, thickness: 0.8 mm).

The initial state of the die bonding layer within the thus obtained semiconductor device was inspected using an ultrasonic inspection apparatus "Hye-Focus" (a brand name, manufactured by Hitachi, Ltd.). Structures in which no voids were detected within the die bonding layer, and in which the indentations within the support member surface had been filled normally were evaluated as "good", whereas structures in which either voids or unfilled indentations were detected were evaluated as "poor".

Furthermore, the state of the die bonding layer when the semiconductor device was first heated for one hour on a hotplate set to a surface temperature of 180° C., before transfer molding was conducted, was also evaluated in the same manner as described above, and recorded as the post-heating state for the adhesive.

inspection apparatus and the metal microscope revealed no peeling or breakdown of the die bonding layer, and by assigning an evaluation of "poor" for those structures in which peeling and/or breakdown were confirmed.

TABLE 3

|  |  | Example 1 | Example 2 | Example 3 | Example 4 | Comparative example 1 | Comparative example 2 | Comparative example 3 | Comparative example 4 |
|---|---|---|---|---|---|---|---|---|---|
| Storage elastic modulus at 20° C. (MPa) | | 24 | 22 | 25 | 20 | 27 | 1630 | 1560 | 2310 |
| Main dispersion peak temperature (° C.) | | −33 | −36 | −24 | −37 | 22 | 53 | 53 | 120 |
| Existence of chip flying | | No | No | No | No | No | No | No | Yes |
| Flow amount | Initial | 400 | 360 | 320 | 800 | 2600 | 420 | 2100 | 44 |
| (μm) | post-heating | 210 | 230 | 180 | 420 | 630 | 0 | 230 | 0 |
| State following transfer molding | Initial | Good | Good | Good | Good | Poor (foaming) | Good | Poor (foaming) | Poor (unfilled) |
|  | post-heating | Good | Good | Good | Good | Good | Poor (unfilled) | Good | Poor (unfilled) |
| Peel strength (N/chip) | | 18 | 19 | 14 | 18 | 6 | 25 | 19 | 44 |
| Reflow resistance | Initial | Good | Good | Good | Good | Poor | Good | Poor | Poor |
|  | post-heating | Good | Good | Good | Good | Poor | Poor | Good | Poor |

<Reflow Resistance>

A semiconductor element (silicon chip) of thickness 280 μm and dimensions of 6.5 mm×6.5 mm was die bonded to a support member comprising a solder resist layer of thickness 15 μm and copper wiring (wiring height: 12 μm) provided on one surface of an organic substrate of thickness 0.1 mm. Specifically, the film-like adhesive of dimensions 6.5 mm×6.5 mm was sandwiched between the surface of the solder resist layer of the support member and the semiconductor element, and die bonding was conducted by applying a pressure of 300 gf (this loading was adjusted so that the film-like adhesive did not bury the wiring on the support member, but was rather maintained in a tent-like state stretched over the top of the wiring) per single semiconductor element for a period of 3 seconds, while heating at a temperature equivalent to the main dispersion peak temperature of the film-like adhesive +100° C.

Additional heating was then conducted at 170° C. for 3 minutes to impart heat history equivalent to that associated with wire bonding, the entire structure was then covered with a sealing material in a transfer molding process (mold temperature: 180° C., cure time: 2 minutes), and the sealing material was then cured by heating in an oven at 180° C. for 5 hours, thereby yielding a semiconductor device (CSP-96 pin, sealed area: 10 mm×10 mm, thickness: 0.8 mm).

The thus obtained semiconductor device was subjected to moisture absorption treatment for 192 hours inside a thermohygrostat set to 30° C. and 60% RH, and was then passed three times through an IR reflow apparatus manufactured by Tamura Corporation (semiconductor package peak surface temperature: 265° C., temperature profile: adjusted in accordance with the JEDEC standard, based on the package surface temperature), thereby imparting heat history equivalent to a reflow process.

Subsequently, an ultrasonic inspection apparatus "HyeFocus" (a brand name, manufactured by Hitachi, Ltd.) was used to inspect the die bonding layer for peeling and breakdown. In addition, the semiconductor device was also cut through the center, and the exposed cross-sectional surface was then polished and inspected using a metal microscope manufactured by Olympus Corporation to inspect the die bonding layer for peeling and breakdown. The reflow resistance was evaluated by assigning an evaluation of "good" for those structures in which the inspections using the ultrasonic Synthesis Example Synthesis of Polyurethaneamideimide Resin (PUAI-1)

A 300 ml flask fitted with a thermometer, a stirrer, a condenser, and a nitrogen inlet tube was charged with 18.68 g of diphenylmethane-4,4'-diisocyanate (manufactured by Wako Pure Chemical Industries, Ltd.), 59.74 g of a polytetramethylene glycol with an average molecular weight of 2,000 (manufactured by Wako Pure Chemical Industries, Ltd.) (equivalent to 0.4 mols of the diol for 1 mol of the diisocyanate), and 130 g of N-methyl-2-pyrrolidone (anhydrous grade), and using this mixture as the reaction liquid, reaction was conducted for one hour under an atmosphere of nitrogen while heating at 100° C., thus producing a urethane oligomer having isocyanate groups at the terminals.

Subsequently, 7.16 g of trimellitic anhydride (1,2,4-benzenetricarboxylic acid 1,2-anhydride) that had undergone preliminary heat treatment for 12 hours in an oven at 140° C. (and exhibited a difference between the endothermic start temperature and the endothermic peak temperature as determined by DSC of 3° C.) (equivalent to 1 mol of the tricarboxylic anhydride for 1 mol of the urethane oligomer) was added to the reaction liquid, and reaction was continued for a further 3 hours while heating at 160° C., thus yielding a solution of a polyurethaneamideimide resin (PUAI-1). Measurement of the thus obtained polyurethaneamideimide resin using GPC revealed polystyrene equivalent values of Mn=45, 200 and Mw=92,400.

Examples 5 and 6

Using varnishes prepared using the materials and composition proportions shown in Table 4, film-like adhesives of thickness 40 μm comprising a polyurethaneamideimide resin were prepared in the same manner as the example 1.

TABLE 4

| Component | Example 5 | Example 6 |
|---|---|---|
| Polyurethaneamideimide resin (parts by weight*) | PUAI-1 (100) | PUAI-1 (100) |

TABLE 4-continued

| Component | Example 5 | Example 6 |
|---|---|---|
| Epoxy resin (parts by weight) | ESCN195 (11.7) | ESCN195 (5.0) |
| Curing agent (parts by weight) | TrisP-PA (8.2) | — |
| Curing accelerator (parts by weight) | TPPK (0.1) | — |
| Filler (% by volume) | HP-P1 (10) | HP-P1 (5) |
| Coating solvent | NMP | NMP |

*Quantity of the polyurethaneamideimide resin (excluding the solvent)

The specific content of the raw materials listed in Table 4 are as described above.

The film-like adhesives of the examples 5 and 6 were evaluated in the same manner as the examples 1 through 4 and the comparative examples 1 through 4. The results of the evaluations are shown in Table 5.

TABLE 5

| Component | Example 5 | Example 6 |
|---|---|---|
| Storage elastic modulus at 20° C. (MPa) | 28 | 20 |
| Main dispersion peak temperature (° C.) | −31 | −52 |
| Existence of chip flying | No | No |
| Flow amount (μm) (initial) | 650 | 757 |
| State following transfer molding (initial) | Good | Good |
| Peel strength (N/chip) | 20 | 22 |
| Reflow resistance (initial) | Good | Good |

Synthesis Examples

Synthesis of
Polyurethaneimide-Polyurethaneamideimide Resin
(PUI-PUAI-1)

A 300 ml flask fitted with a thermometer, a stirrer, a condenser, and a nitrogen inlet tube was charged with 14.01 g of diphenylmethane-4,4'-diisocyanate (manufactured by Wako Pure Chemical Industries, Ltd.), 44.78 g of a polytetramethylene glycol with an average molecular weight of 2,000 (manufactured by Wako Pure Chemical Industries, Ltd.) (equivalent to 0.4 mols of the diol for 1 mol of the diisocyanate), and 59.72 g of N-methyl-2-pyrrolidone (anhydrous grade), and using this mixture as the reaction liquid, reaction was conducted for one hour under an atmosphere of nitrogen while heating at 100° C., thus producing a urethane oligomer having isocyanate groups at the terminals.

Subsequently, 1.22 g of pyromellitic anhydride (which exhibited a difference between the endothermic start temperature and the endothermic peak temperature as determined by DSC of 2.6° C., this also applies below), 4.30 g of trimellitic anhydride (which exhibited a difference between the endothermic start temperature and the endothermic peak temperature as determined by DSC of 5° C., this also applies below) (equivalent to 0.2 mols of the tetracarboxylic anhydride and 0.8 mols of the tricarboxylic anhydride for 1 mol of the urethane oligomer), and another 59.72 g of the aforementioned N-methyl-2-pyrrolidone were added to the reaction liquid, and reaction was continued for a further 3 hours while heating at 160° C., thus yielding a solution of a polyurethaneimide-polyurethaneamideimide resin (PUI-PUAI-1). Measurement of the thus obtained polyurethaneimide-polyurethaneamideimide resin using GPC revealed polystyrene equivalent values of Mn=53,700 and Mw=112,300.

Synthesis of
Polyurethaneimide-Polyurethaneamideimide Resin
(PUI-PUAI-2)

A 300 ml flask fitted with a thermometer, a stirrer, a condenser, and a nitrogen inlet tube was charged with 14.01 g of diphenylmethane-4,4'-diisocyanate (manufactured by Wako Pure Chemical Industries, Ltd.), 44.78 g of a polytetramethylene glycol with an average molecular weight of 2,000 (manufactured by Wako Pure Chemical Industries, Ltd.) (equivalent to 0.4 mols of the diol for 1 mol of the diisocyanate), and 60.20 g of N-methyl-2-pyrrolidone (anhydrous grade), and using this mixture as the reaction liquid, reaction was conducted for one hour under an atmosphere of nitrogen while heating at 100° C., thus producing a urethane oligomer having isocyanate groups at the terminals.

Subsequently, 1.74 g of 4,4'-oxydiphthalic anhydride (which exhibited a difference between the endothermic start temperature and the endothermic peak temperature as determined by DSC of 2.7° C., this also applies below), 4.30 g of trimellitic anhydride (equivalent to 0.2 mols of the tetracarboxylic anhydride and 0.8 mols of the tricarboxylic anhydride for 1 mol of the urethane oligomer), and another 60.20 g of the aforementioned N-methyl-2-pyrrolidone were added to the reaction liquid, and reaction was continued for a further 3 hours while heating at 160° C., thus yielding a solution of a polyurethaneimide-polyurethaneamideimide resin (PUI-PUAI-2). Measurement of the thus obtained polyurethaneimide-polyurethaneamideimide resin using GPC revealed polystyrene equivalent values of Mn=46,400 and Mw=94,700.

Synthesis of
Polyurethaneimide-Polyurethaneamideimide Resin
(PUI-PUAI-3)

A 300 ml flask fitted with a thermometer, a stirrer, a condenser, and a nitrogen inlet tube was charged with 14.01 g of diphenylmethane-4,4'-diisocyanate (manufactured by Wako Pure Chemical Industries, Ltd.), 44.78 g of a polytetramethylene glycol with an average molecular weight of 2,000 (manufactured by Wako Pure Chemical Industries, Ltd.) (equivalent to 0.4 mols of the diol for 1 mol of the diisocyanate), and 61.12 g of N-methyl-2-pyrrolidone (anhydrous grade), and using this mixture as the reaction liquid, reaction was conducted for one hour under an atmosphere of nitrogen while heating at 100° C., thus producing a urethane oligomer having isocyanate groups at the terminals.

Subsequently, 4.34 g of 4,4'-oxydiphthalic anhydride, 2.69 g of trimellitic anhydride (equivalent to 0.5 mols of the tetracarboxylic anhydride and 0.5 mols of the tricarboxylic anhydride for 1 mol of the urethane oligomer), and another 61.12 g of the aforementioned N-methyl-2-pyrrolidone were added to the reaction liquid, and reaction was continued for a further 3 hours while heating at 160° C., thus yielding a solution of a polyurethaneimide-polyurethaneamideimide resin (PUI-PUAI-3). Measurement of the thus obtained polyurethaneimide-polyurethaneamideimide resin using GPC revealed polystyrene equivalent values of Mn=43,100 and Mw=86,900.

Synthesis of
Polyurethaneimide-Polyurethaneamideimide Resin
(PUI-PUAI-4)

A 300 ml flask fitted with a thermometer, a stirrer, a condenser, and a nitrogen inlet tube was charged with 14.01 g of diphenylmethane-4,4'-diisocyanate (manufactured by Wako Pure Chemical Industries, Ltd.), 44.78 g of a polytetramethylene glycol with an average molecular weight of 2,000 (manufactured by Wako Pure Chemical Industries, Ltd.) (equivalent to 0.4 mols of the diol for 1 mol of the diisocyanate), and 61.73 g of N-methyl-2-pyrrolidone (anhydrous grade), and using this mixture as the reaction liquid, reaction was conducted for one hour under an atmosphere of nitrogen while heating at 100° C., thus producing a urethane oligomer having isocyanate groups at the terminals.

Subsequently, 6.08 g of 4,4'-oxydiphthalic anhydride, 1.61 g of trimellitic anhydride (equivalent to 0.7 mols of the tetracarboxylic anhydride and 0.3 mols of the tricarboxylic anhydride for 1 mol of the urethane oligomer), and another 61.73 g of the aforementioned N-methyl-2-pyrrolidone were added to the reaction liquid, and reaction was continued for a further 3 hours while heating at 160° C., thus yielding a solution of a polyurethaneimide-polyurethaneamideimide resin (PUI-PUAI-4). Measurement of the thus obtained polyurethaneimide-polyurethaneamideimide resin using GPC revealed polystyrene equivalent values of Mn=46,900 and Mw=93,500.

Examples 7 to 11

Using varnishes prepared using the materials and composition proportions shown in Table 6, film-like adhesives of thickness 40 μm comprising a polyurethaneimide-polyurethaneamideimide resin were prepared in the same manner as the example 1.

TABLE 6

| Component | Example 7 | Example 8 | Example 9 | Example 10 | Example 11 |
|---|---|---|---|---|---|
| Polyurethaneimide-polyurethaneamideimide resin (parts by weight*) | PUI-PUAI-1 (100) | PUI-PUAI-2 (100) | PUI-PUAI-3 (100) | PUI-PUAI-4 (100) | PUI-PUAI-4 (100) |
| Epoxy resin (parts by weight) | ESCN195 (5.0) | ESCN195 (5.0) | ESCN195 (5.0) | ESCN195 (5.0) | ESCN195 (11.7) |
| Curing agent (parts by weight) | — | — | — | — | TrisP-PA (8.2) |
| Curing accelerator (parts by weight) | — | — | — | — | TPPK (0.1) |
| Filler (% by volume) | HP-P1 (5) | HP-P1 (5) | HP-P1 (5) | HP-P1 (5) | HP-P1 (5) |
| Coating solvent | NMP | NMP | NMP | NMP | NMP |

*Quantity of the polyurethaneimide-polyurethaneamideimide resin (excluding the solvent)

The specific content of the raw materials listed in Table 6 are as described above.

The film-like adhesives of the examples 7 through 11 were evaluated in the same manner as the examples 1 through 4 and the comparative examples 1 through 4. The results of the evaluations are shown in Table 7.

TABLE 7

| Component | | Example 7 | Example 8 | Example 9 | Example 10 | Example 11 |
|---|---|---|---|---|---|---|
| Storage elastic modulus at 20° C. (MPa) | | 28 | 25 | 20 | 15 | 22 |
| Main dispersion peak temperature (° C.) | | −36 | −38 | −42 | −53 | −44 |
| Existence of chip flying | | No | No | No | No | No |
| Flow amount (μm) | Initial | 610 | 790 | 830 | 850 | 550 |
| | post-heating | 110 | 150 | 210 | 366 | 250 |
| State following transfer molding | Initial | Good | Good | Good | Good | Good |
| | post-heating | Good | Good | Good | Good | Good |
| Peel strength (N/chip) | | 20 | 26 | 25 | 24 | 22 |
| Reflow resistance | Initial | Good | Good | Good | Good | Good |
| | post-heating | Good | Good | Good | Good | Good |

The invention claimed is:

1. A film-like adhesive used for bonding a semiconductor element to an adherend, wherein the film-like adhesive has an adhesive layer comprising a polyurethaneimide-polyurethaneamideimide resin, and wherein the polyurethaneimide-polyurethaneamideimide resin comprises a polymer having:

(1) a partial structure represented by a formula (1a) shown below:

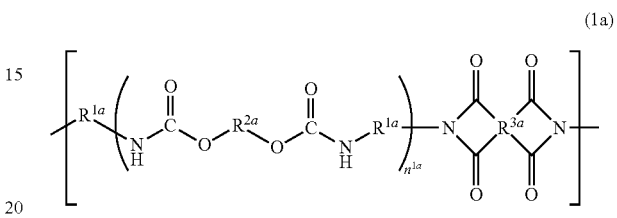

(1a)

[wherein, $R^{1a}$ represents a bivalent organic group comprising either an aromatic ring, or a straight-chain, branched or cyclic aliphatic hydrocarbon, $R^{2a}$ represents a bivalent organic group with a molecular weight within a range from 100 to 10,000, $R^{3a}$ represents a tetravalent organic group containing a total number of carbon atoms of 4 or greater, and $n^{1a}$ represents an integer from 1 to 100], and (2) a partial structure represented by a formula (1b) shown below:

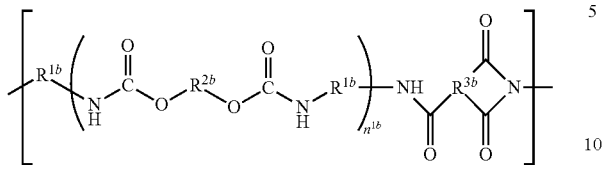

(1b)

[wherein, $R^{1b}$ represents a bivalent organic group containing either an aromatic ring, or a straight-chain, branched or cyclic aliphatic hydrocarbon, $R^{2b}$ represents a bivalent organic group with a molecular weight within a range from 100 to 10,000, $R^{3b}$ represents a trivalent organic group containing a total number of carbon atoms of 4 or greater, and $n^{1b}$ represents an integer from 1 to 100].

2. The film-like adhesive according to claim 1, wherein the polyurethaneimide-polyurethaneamideimide resin comprises a block copolymer produced by subjecting a urethane oligomer having terminal isocyanate groups, generated by a reaction between a diisocyanate and a diol, to a chain extension using a tetracarboxylic dianhydride and a tricarboxylic anhydride.

3. The film-like adhesive according to claim 2, wherein the diisocyanate comprises a compound represented by a formula (10) shown below.

[Formula 11]

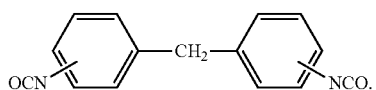

(10)

4. The film-like adhesive according to claim 2, wherein the diol comprises a compound represented by a formula (20) shown below:

[Formula 12]

HO—(CH₂CH₂CH₂CH₂O)$_{n^{20}}$H (20)

[wherein, $n^{20}$ represents an integer from 1 to 100].

5. The film-like adhesive according to claim 2, wherein the tetracarboxylic dianhydride comprises a compound represented by a formula (30) shown below.

[Formula 13]

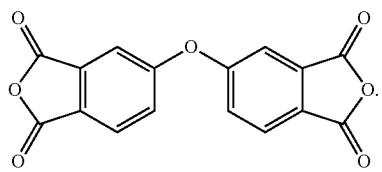

(30)

6. The film-like adhesive according to claim 2, wherein the tricarboxylic anhydride comprises a compound represented by a formula (40) shown below.

[Formula 14]

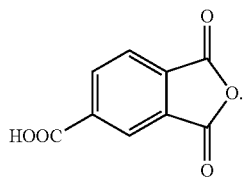

(40)

7. The film-like adhesive according to claim 1, wherein a weight average molecular weight of the polyurethaneimide-polyurethaneamideimide resin is within a range from 10,000 to 300,000.

8. The film-like adhesive according to claim 1, wherein a main dispersion peak temperature in a dynamic viscoelasticity measurement of the adhesive layer is within a range from −100 to 50° C.

9. The film-like adhesive according to claim 1, wherein a storage elastic modulus at 20° C. in a dynamic viscoelasticity measurement of the adhesive layer is no more than 1,000 MPa.

10. The film-like adhesive according to claim 1, wherein a flow amount for the adhesive layer when subjected to pressurization at 9.8 MPa for 90 seconds while being heated at 180° C. is within a range from 50 to 2,000 μm.

11. The film-like adhesive according to claim 1, wherein a flow amount for the adhesive layer when heated for one hour at 180° C., and subsequently subjected to pressurization at 9.8 MPa for 90 seconds while being heated at 180° C., is within a range from 50 to 2,000 μm.

12. The film-like adhesive according to claim 2, wherein a ratio between the tetracarboxylic dianhydride and the tricarboxylic anhydride, where a sum thereof is 1.0 mol, is 0.05 to 0.95 mol of the tetracarboxylic dianhydride and 0.95 to 0.05 mol of the tricarboxylic anhydride.

\* \* \* \* \*